US010516410B2

(12) United States Patent
Hiraide et al.

(10) Patent No.: US 10,516,410 B2
(45) Date of Patent: Dec. 24, 2019

(54) A/D CONVERTER AND A/D CONVERSION DEVICE

(71) Applicant: OLYMPUS CORPORATION, Hachioji-shi, Tokyo (JP)

(72) Inventors: Shuzo Hiraide, Tokyo (JP); Yasunari Harada, Ebina (JP); Masato Osawa, Tokyo (JP); Hideki Kato, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/100,534

(22) Filed: Aug. 10, 2018

(65) Prior Publication Data

US 2018/0351568 A1 Dec. 6, 2018

Related U.S. Application Data

(63) Continuation of application No. PCT/JP2016/059925, filed on Mar. 28, 2016.

(51) Int. Cl.
*H03M 1/46* (2006.01)
*H01G 4/012* (2006.01)
(Continued)

(52) U.S. Cl.
CPC .............. *H03M 1/46* (2013.01); *H01G 4/012* (2013.01); *H01L 23/5223* (2013.01);
(Continued)

(58) Field of Classification Search
CPC ................... H03M 1/46; H01G 4/012; H01G 4/38; H01L 23/5223; H01L 23/5225
(Continued)

(56) References Cited

U.S. PATENT DOCUMENTS 6,707,403 B1 * 3/2004 Hurrell ............... H03M 1/1061
341/120
9,722,624 B2 * 8/2017 Lee ..................... H03M 1/468
(Continued)

FOREIGN PATENT DOCUMENTS

JP 2012-509594 A 4/2012
JP 2014-120615 A 6/2014
(Continued)

OTHER PUBLICATIONS

International Search Report dated Jun. 7, 2016, issued in counterpart International Application No. PCT/JP2016/059925 w/English Translation (3 pages).
(Continued)

*Primary Examiner* — Brian K Young
(74) *Attorney, Agent, or Firm* — Westerman, Hattori, Daniels & Adrian, LLP

(57) ABSTRACT

An A/D converter includes: a first wiring layer including a first A/D conversion circuit including a first capacitor group in which a plurality of weighted unit capacitors are connected in parallel and a second capacitor group in which a plurality of unit capacitors are connected in parallel, the second capacitor group being connected in parallel with the first capacitor group; and a second wiring layer including a second A/D conversion circuit including a third capacitor group in which a plurality of weighted unit capacitors are connected in parallel and a fourth capacitor group in which a plurality of unit capacitors are connected in parallel, the fourth capacitor group being connected in parallel with the third capacitor group, in which the first wiring layer and the second wiring layer are stacked such that the first A/D conversion circuit and the second A/D conversion circuit are disposed at overlapping positions.

8 Claims, 15 Drawing Sheets

(51) Int. Cl.
   *H01L 23/522*   (2006.01)
   *H01G 4/38*     (2006.01)
   *H01G 4/40*     (2006.01)
(52) U.S. Cl.
   CPC ........... *H01L 23/5225* (2013.01); *H01G 4/38* (2013.01); *H01G 4/40* (2013.01); *H03M 1/466* (2013.01)
(58) Field of Classification Search
   USPC .................................................. 341/144, 155
   See application file for complete search history.

(56)               References Cited

U.S. PATENT DOCUMENTS 10,205,462 B2*   2/2019   Shen ....................... H03M 1/08
   10,237,507 B2*   3/2019   Bairo .................... H01L 21/822
   2014/0167992 A1  6/2014   Aruga
   2015/0236711 A1  8/2015   Aruga et al.

FOREIGN PATENT DOCUMENTS

JP      2015-154058 A    8/2015
   WO      2012/056607 A1   5/2012

OTHER PUBLICATIONS

Harpe et al., "A 26 μW 8 bit 10 MS/s Asynchronous SAR ADC for Low Energy Radios", IEEE Journal of Solid State Circuits, vol. 46, No. 7, Jul. 2011, pp. 1585-1595, (11 pages).

\* cited by examiner

«A/D CONVERTER AND A/D CONVERSION DEVICE»

CROSS REFERENCE TO RELATED APPLICATIONS

This application is a continuation application according to a PCT Patent Application No. PCT/JP2016/059925, filed on Mar. 28, 2016, the entire content of which is hereby incorporated by reference.

BACKGROUND

Technical Field

The present invention relates to an A/D converter and an A/D conversion device. More specifically, the present invention relates to a successive approximation type A/D converter of an electric charge redistribution type using capacitance between wirings generated in a horizontal direction of a same wiring layer called metal oxide metal (MOM) capacitance as a digital-to-analog converter (DAC) capacitor and an A/D conversion device including a plurality of successive approximation type A/D converters.

Background Art

As an A/D converter having low power consumption, for example, a successive approximation type A/D converter of differential-input asynchronous communication disclosed in "A 26 µW 8 bit 10 MS/s Asynchronous SAR ADC for Low Energy Radios, Pieter J. A. Harpe, et al. IEEE JOURNAL OF SOLID-STATE CIRCUITS, Vol. 46, No. 7, JULY 2011, pp. 1585-1595" is known. Most of a successive approximation type A/D converter can be configured using digital circuits without analog circuits such as operational amplifiers. For this reason, an A/D converter can be realized in a small size using a fine complementary metal oxide semiconductor (CMOS) process, and the power consumption can be decreased. In view of enabling such low power consumption and a decrease in size, a successive approximation type A/D converter, for example, is used for a system large scale integration (LSI) of a mobile device and the like.

FIG. 14 is a block diagram illustrating the configuration of a successive approximation type A/D converter of differential-input asynchronous communication according to a conventional technology. The successive approximation type A/D converter 10 includes a sample hold circuit 11, a capacitive DAC circuit 12, a comparator 2, and a successive approximation logic circuit 3. The sample hold circuit 11 and the capacitive DAC circuit 12 configure a capacitor network 1.

The sample hold circuit 11 holds an analog signal input as a differential input signal and samples the analog signal to be taken in the successive approximation type A/D conversion device 10. The operation of the sample hold circuit 11 is controlled on the basis of a clock signal CLK.

The capacitive DAC circuit 12 generates a reference signal based on digital signals D0 to D7 of 8 bits generated by the successive approximation logic circuit 3 and subtracts the reference signal from the analog signal held and sampled by the sample hold circuit 11, thereby acquiring an accumulated residual between the differential input signal and the digital signals D0 to D7. The capacitive DAC circuit 12 outputs a result of the subtraction of the reference signal from the analog signal to the comparator 2 as an analog signal (voltage signal) that reflects the accumulated residual.

The comparator 2 compares the analog signal (voltage signal) with the reference signal that is an output of the capacitive DAC circuit 12 and outputs a comparison voltage signal.

The successive approximation logic circuit 3 successively determines the value of each bit of the comparison voltage signal in accordance with a binary search algorithm (binary search method). Then, the successive approximation logic circuit 3 generates the value (a digital output of "0" or "1") of each bit from a most significant bit (MSB) to a least significant bit (LSB) of a digital signal corresponding to the differential input signal and feeds back the generated value of each of the bits to the reference signal. By repeating this, converted bits from the MSB to the LSB are sequentially generated.

In the case illustrated in FIG. 14, the comparator 2 is a dynamic-type comparator. The dynamic-type comparator, similar to a CMOS logic, is a circuit through which only a through current flows at an operation time. In other words, in the comparator 2, a current flows only when the clock signal CLK transitions from high to low or from low to high. In other words, the comparator 2 is a circuit not requiring a steady current (idling current).

FIG. 15 is a circuit diagram illustrating one example of the configuration of a capacitive DAC circuit according to a conventional technology. One pair of analog signals are input to the capacitive DAC circuit 12 from terminals INP and INN through the sample hold circuit 11. The capacitive DAC circuit 12 includes a DAC capacitor group 21 (C0 to C7) and an attenuation capacitor 22 (Ch). The DAC capacitor group 21 (C0 to C7) is a DAC capacitor group of 8 bits, and the capacitance values thereof are binary-weighted by connecting unit capacitors (Cu) in parallel. The capacitance values of the DAC capacitor group 21 (C0 to C7) are indicated in the following Equation (1).

$$\left.\begin{array}{l} C0 = 2^0 Cu = Cu \\ C1 = 2^1 Cu = 2Cu \\ C2 = 2^2 Cu = 4Cu \\ \phantom{C0 = 2^0 }\ldots \\ C7 = 2^7 Cu = 128Cu \end{array}\right\} \quad (1)$$

In other words, the DAC capacitor C0 is configured of one unit capacitor Cu. The DAC capacitor C1 is configured of two unit capacitors Cu. The DAC capacitor C2 is configured of four unit capacitors Cu. The DAC capacitor C7 is configured of 128 unit capacitors Cu.

In addition, a total Cdac of the capacitance values of the DAC capacitor group 21 (C0 to C7) is represented in the following Equation (2).

$$Cdac = \sum_{i=0}^{7} Ci \quad (2)$$

The attenuation capacitor 22 (Ch) is an attenuation capacitor used for determining a full-scale range. The attenuation capacitor 22 (Ch), similar to the DAC capacitor group 21 (C0 to C7), is formed by connecting unit capacitors Cu in parallel. First ends of the DAC capacitor group 21 (C0 to C7) and the attenuation capacitor 22 (Ch) are connected to a first end of the sample hold circuit 11 and an input terminal of the comparator 2 through wirings DACOUTP and DACOUTN.

Second ends of the DAC capacitor group 21 (C0 to C7) are connected to a DAC driver 23 configured of inverters through bit-input wirings BIT0 to BIT7, and digital signals D0 to D7 supplied from the successive approximation logic circuit 3 are input thereto. Accordingly, the DAC capacitor group 21 (C0 to C7) is controlled by the successive approximation logic circuit 3. Here, a power source voltage of the DAC driver 23 is VDD. In addition, a second end of the attenuation capacitor 22 (Ch) is connected to a ground wiring GND.

FIGS. 16A and 16B are diagrams illustrating a unit capacitor Cu configuring the DAC capacitor group 21 (C0 to C7) and the attenuation capacitor 22 (Ch) in a capacitive DAC circuit according to a conventional technology. FIG. 16A is a pattern layout diagram of the unit capacitor Cu, and FIG. 16B is a perspective view of the unit capacitor Cu.

The unit capacitor Cu is realized by inter-wiring capacitance generated in a horizontal direction (a direction X in the drawing) of a same wiring layer called a metal oxide metal (MOM) capacitor. In other words, as illustrated in FIGS. 16A and 16B, the unit capacitor Cu is realized by inter-wiring capacitance formed between a metal wiring K1 and a metal wiring K2 formed on a semiconductor substrate with a predetermined gap interposed therebetween. Here, the unit capacitor Cu is inter-electrode capacitance between tandem electrodes configured of the metal wiring K1 and the metal wiring K2. Each capacitor of the DAC capacitor group 21 (C0 to C7) is formed by connecting unit capacitors Cu corresponding to a capacitance value thereof in parallel.

Unlike a metal insulator metal (MIM) capacitor having a stacking structure in which a general insulating layer is interposed between metals, according to the MOM capacitor, minute capacitance can be formed in accordance with miniaturization of a semiconductor process. For example, according to a conventional technology, a MOM capacitor realizes a capacitance value of a unit capacitor as Cu=0.5 fF. In other words, by using the MOM capacitor, a high capacitance density can be formed using minute capacitance.

FIG. 17 is a top view illustrating the layout of a DAC capacitor group C0 to C7 and an attenuation capacitor Ch in a capacitive DAC circuit according to a conventional technology. FIG. 18A is a cross-sectional view taken along line XVIIIA-XVIIIA illustrated in FIG. 17, and FIG. 18B is a cross-sectional view taken along line XVIIIB-XVIIIB illustrated in FIG. 17. In addition, a configuration that is not in a cross-section but that would be visible from a side face is represented using broken lines in the drawing. As illustrated in FIGS. 17, 18A, and 18B, the capacitive DAC circuit is formed of three layers (a first metal layer L1, a second metal layer L2, and a third metal layer L3). More specifically, on the first metal layer L1 that is a GND plane, the second metal layer L2 configuring MON capacitors (a DAC capacitor group C0 to C7 and an attenuation capacitor Ch) and a wiring DACOUT is formed. On the second metal layer, the third metal layer L3 configuring bit-input wirings BIT0 to BIT7 and a ground wiring GND is formed.

Each of the DAC capacitor group C0 to C7 and the attenuation capacitor Ch is formed by arranging and integrating unit capacitors Cu on the second metal layer L2 in a horizontal direction (a direction X in the drawing). In the drawing, although only DAC capacitors C0, C1, and C2 are illustrated as the DAC capacitor group, actually, there are capacitors C0 to C7 as the DAC capacitor group. The DAC capacitors C0, C1, C2, . . . are respectively connected to bit-input wirings BIT0, BIT1, BIT2, . . . on the third metal layer L3. The attenuation capacitor Ch is connected to the ground wiring GND on the third metal layer L3.

The amounts of power consumed by DAC drivers D0 to D7 are respectively proportional to the capacitance values of the corresponding DAC capacitor group C0 to C7. Accordingly, by decreasing the capacitance values of the DAC capacitor group C0 to C7 and the attenuation capacitor Ch, the power consumption of the DAC drivers D0 to D7 can be suppressed.

As described above, in the successive approximation A/D converter according to the conventional technology, by configuring the DAC capacitor group and the attenuation capacitor from unit capacitors using MOM capacitors using a dynamic-type comparator, an A/D converter having low power consumption is realized.

In the successive approximation type A/D converter, an input signal is estimated by repeating a binary search algorithm the number of times corresponding to the number of bits. Accordingly, a time required for the A/D conversion increases in proportion to the number of bits. For this reason, it is difficult to realize A/D conversion of high resolution and high speed using a single successive approximation type A/D converter.

As a technique for realizing the A/D conversion of high resolution and high speed, there is a time interleave type using two successive approximation type A/D converters. FIG. 19 is a block diagram illustrating the configuration of a successive approximation type A/D converter of a two-channel time interleave type using two successive approximation type A/D converters according to a conventional technology. A first successive approximation type A/D converter ADC1 and a second successive approximation type A/D converter ADC2 have the same structure, and outputs thereof are connected to a multiplexer MUX.

The first successive approximation type A/D converter ADC1 is driven at a clock frequency CLK1, and the second successive approximation type A/D converter ADC2 is driven at a clock frequency CLK2. Here, while the clock frequency CLK1 and the clock frequency CLK2 are the same frequency, the phases thereof deviate from each other by a half cycle, in other words, sampling timings deviate from each other by a ½ clock cycle. Accordingly, the successive approximation type A/D converter of the two-channel time interleave type can acquire an A/D conversion speed that is twice that of one successive approximation type A/D converter.

Every time the resolution of the successive approximation type A/D converter is increased by one bit, it is necessary to double the DAC capacitor. Accordingly, in a case in which the resolution of the successive approximation type A/D converter is to be increased, the DAC capacitor is increased by $2^n$ times, and the ratio of the capacitive DAC circuit occupying a chip area of the successive approximation type A/D converter increases.

FIG. 20 is a top view illustrating a chip of a successive approximation type A/D converter according to a conventional technology. As illustrated in FIG. 20, a capacitor network 1 including a sample hold circuit 11 and a capacitive DAC circuit 12, a comparator 2, and a successive approximation logic circuit 3 are disposed on the chip.

FIG. 21 is a top view illustrating an example of layout design of a successive approximation type A/D converter of a 9-bit two-channel interleave type according to a conventional technology. As illustrated in FIG. 21, on the layout, a first successive approximation type A/D converter ADC1, a second successive approximation type A/D converter ADC2, and a multiplexer MUX are disposed. On each of the first successive approximation type A/D converter ADC1 and the second successive approximation type A/D converter ADC2, a capacitor network 1 including a sample hold circuit 11 and a capacitive DAC circuit 12, a comparator 2, and a successive approximation logic circuit 3 are disposed.

SUMMARY

According to a first aspect of the present invention, an A/D converter includes: a first wiring layer including a first A/D conversion circuit including a first capacitor group in which a plurality of weighted unit capacitors are connected in parallel and a second capacitor group in which a plurality of unit capacitors are connected in parallel, the second capacitor group being connected in parallel with the first capacitor group; and a second wiring layer including a second A/D conversion circuit including a third capacitor group in which a plurality of weighted unit capacitors are connected in parallel and a fourth capacitor group in which a plurality of unit capacitors are connected in parallel, the fourth capacitor group being connected in parallel with the third capacitor group, in which the first wiring layer and the second wiring layer are stacked such that the first A/D conversion circuit and the second A/D conversion circuit are disposed at overlapping positions.

According to a second aspect of the present invention, the A/D converter according to the first aspect described above may further include: a third wiring layer disposed between the first wiring layer and the second wiring layer and between a set of the first capacitor group and the second capacitor group and a set of the third capacitor group and the fourth capacitor group and connected to a ground electric potential.

According to a third aspect of the present invention, an A/D converter includes: a first wiring layer including a first capacitor group in which a plurality of weighted unit capacitors are connected in parallel; and a second wiring layer including a second capacitor group, in which a plurality of unit capacitors are connected in parallel, connected to the first capacitor group, in which the first wiring layer and the second wiring layer are stacked such that the first capacitor group and the second capacitor group are disposed at overlapping positions.

According to a fourth aspect of the present invention, the A/D converter according to the third aspect described above may further include a third wiring layer disposed between the first wiring layer and the second wiring layer and between the first capacitor group and the second capacitor group and connected to a ground electric potential.

According to a fifth aspect of the present invention, in the A/D converter according to the fourth aspect described above, a ground wiring of the second capacitor group may be connected to the third wiring layer.

According to a sixth aspect of the present invention, in the A/D converter according to any one of the third to fifth aspects, bit-input wirings connected to the first capacitor group may be formed in the second wiring layer including the second capacitor group.

According to a seventh aspect of the present invention, in the A/D converter according to any one of the first to sixth aspects described above, each of the first capacitor group and the second capacitor group may be a MOM capacitor configured of inter-wiring capacitance generated in a horizontal direction of the same wiring layer.

According to an eighth aspect of the present invention, an A/D conversion device includes a plurality of the A/D converters according to any one of the third to seventh aspects described above, in which a plurality of wiring layers are stacked such that all the first capacitor groups and all the second capacitor groups included in the plurality of the A/D converters are disposed at overlapping positions.

DETAILED DESCRIPTION OF THE PREFERRED EMBODIMENTS

Hereinafter, embodiments of the present invention will be described with reference to the drawings. In the following embodiments, the constituent elements and the functions of a successive approximation type A/D converter are not changed from those according to a conventional technology, and thus description thereof will not be presented here. In addition, in the description of the following embodiments, while a successive approximation type A/D conversion device is an A/D conversion device of an 8-bit output, the present invention is not limited to this example, and the number of output bits of the successive approximation type A/D conversion device may be arbitrarily set.

First Embodiment

A successive approximation type A/D converter according to a first embodiment of the present invention will be described. While the successive approximation type A/D converter according to the first embodiment is a successive approximation type A/D converter of a two-channel time interleave type, unlike a conventional technology, a capacitive DAC of a first successive approximation type A/D converter ADC1 and a capacitive DAC of a second successive approximation type A/D converter ADC2 are formed in different wiring layers and are arranged to overlap each other in a vertical direction (stacking direction).

Figure 1:
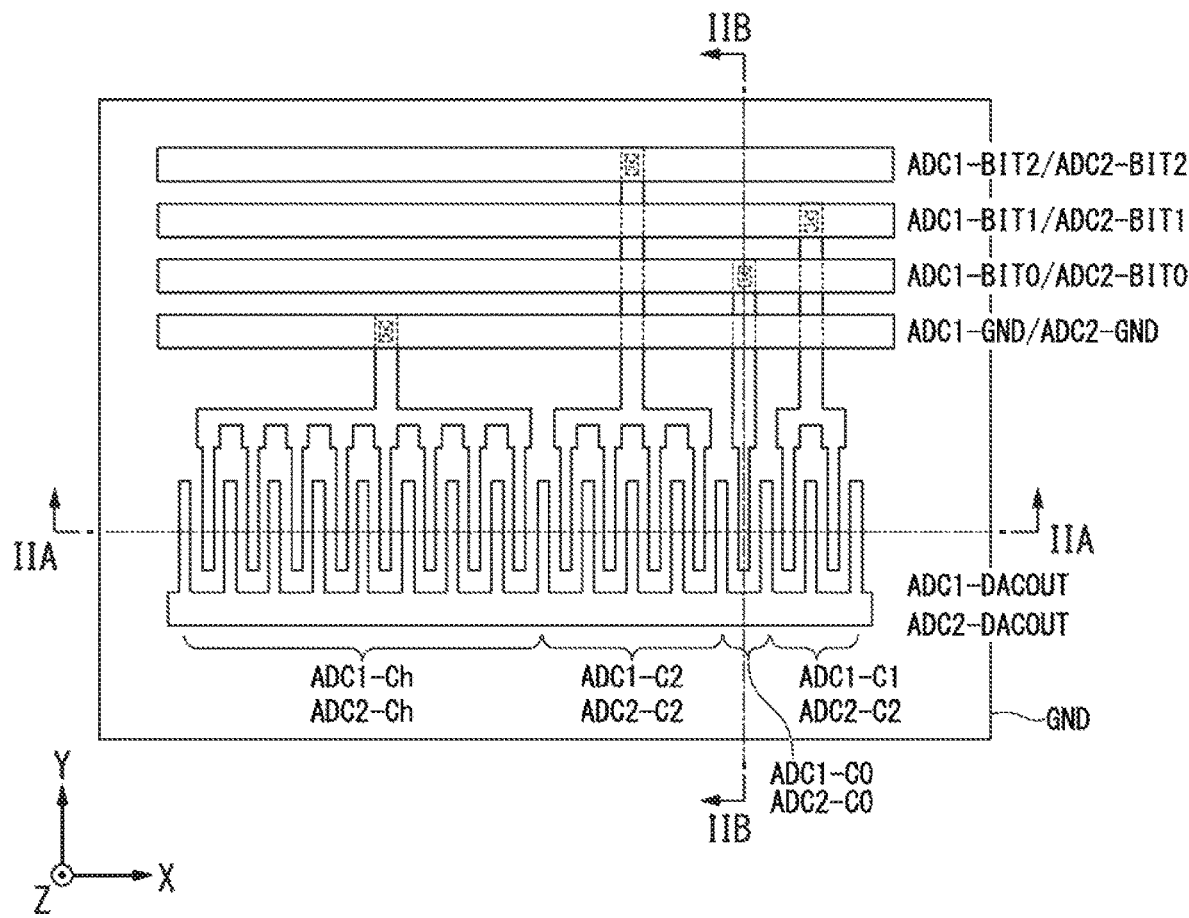
FIG. 1 is a top view illustrating the layout of a DAC capacitor group and an attenuation capacitor in a successive approximation type A/D converter according to a first embodiment of the present invention.
Figure 2A:
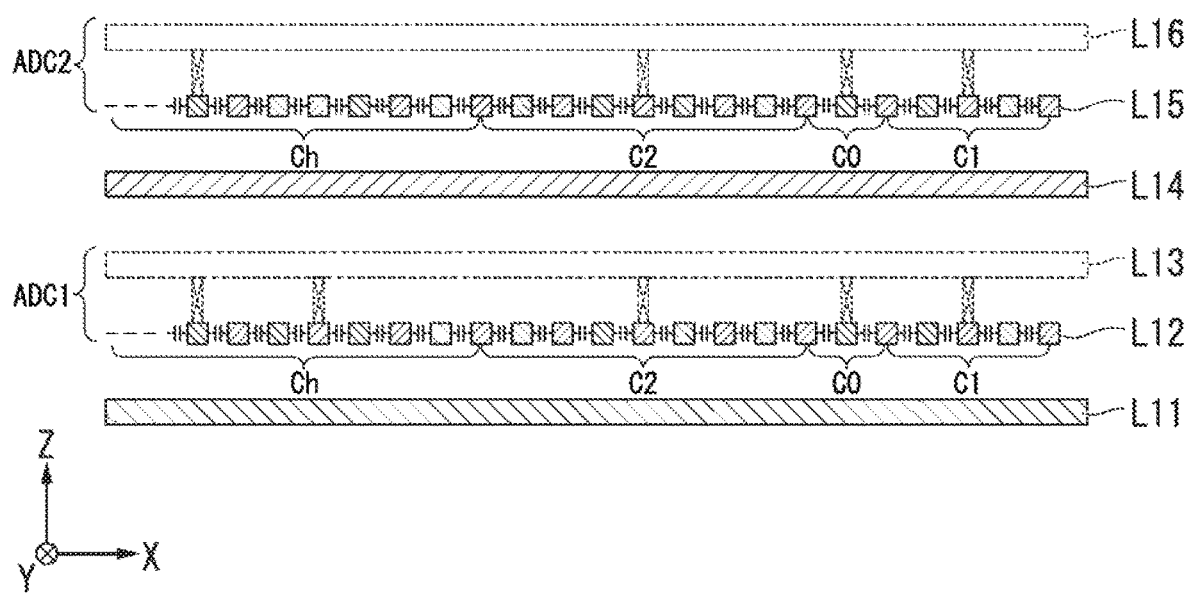
FIG. 2A is a cross-sectional view taken along line IIA-IIA illustrated in FIG. 1.
Figure 2B:
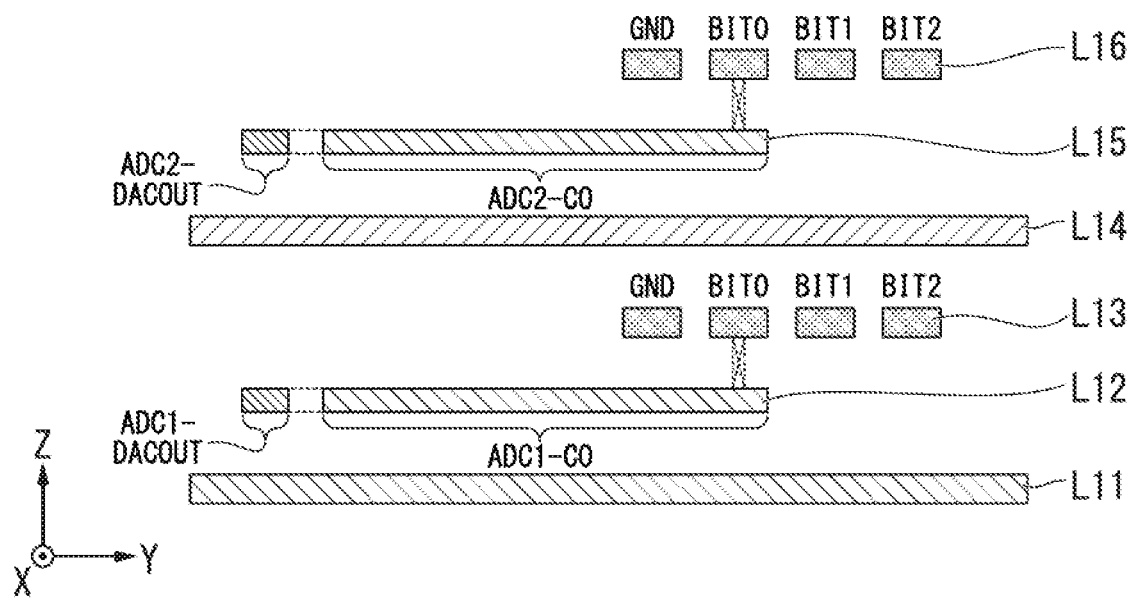
FIG. 2B is a cross-sectional view taken along line IIB-IIB illustrated in FIG. 1.

FIG. 1 is a top view illustrating the layout of a DAC capacitor group and an attenuation capacitor in stacked capacitive DAC circuits of a successive approximation type A/D converter according to the first embodiment of the present invention. FIG. 2A is a cross-sectional view taken along line IIA-IIA illustrated in FIG. 1, and FIG. 2B is a cross-sectional view taken along line IIB-IIB illustrated in FIG. 1. In addition, a configuration that is not in a cross-section but that would be visible from a side face is represented using broken lines in the drawing. The successive approximation type A/D converter according to the first embodiment, as illustrated in FIGS. 1, 2A, and 2B, is formed of six layers (a first metal layer L11, a second metal layer L12, a third metal layer L13, a fourth metal layer L14, a fifth metal layer L15, and a sixth metal layer L16).

More specifically, on the first metal layer L11 that is a GND plane for shielding, the second metal layer (first wiring layer) L12 configuring a DAC capacitor group (first capacitor group) and an attenuation capacitor (second capacitor group) that are MOM capacitors of the first successive approximation type A/D converter ADC1 and a common electrode wiring ADC1-DACOUT of the first successive approximation type A/D converter ADC1 is formed. On the second metal layer L12, the third metal layer L13 configuring bit-input wirings ADC1-BIT0, . . . , ADC1-BIT7 and a ground wiring ADC1-GND of the first successive approximation type A/D converter ADC1 is formed.

On the third metal layer L13, the fourth metal layer (third wiring layer) L14 that is a GND plane for shielding is formed. On the fourth metal layer L14, the fifth metal layer (second wiring layer) L15 configuring a DAC capacitor group (third capacitor group) and an attenuation capacitor (fourth capacitor group) that are MOM capacitors of the second successive approximation type A/D converter ADC2 and a common electrode wiring ADC2-DACOUT of the second successive approximation type A/D converter ADC2 is formed. On the fifth metal layer L15, the sixth metal layer L16 configuring bit-input wirings ADC2-BIT0, . . . , ADC2-BIT7 and a ground wiring ADC2-GND of the second successive approximation type A/D converter ADC2 is formed.

Each of the DAC capacitor group ADC1-C0, . . . , ADC1-C7 and the attenuation capacitor ADC1-Ch of the first successive approximation type A/D converter ADC1 is formed by arranging and integrating unit capacitors Cu in a horizontal direction (a direction X in the drawing) on the second metal layer L12. Although only the DAC capacitors ADC1-C0, ADC1-C1, and ADC1-C2 are illustrated as the DAC capacitor group in the drawing, the DAC capacitor group actually includes DAC capacitors ADC1-C0, . . . , ADC1-C7. The DAC capacitors ADC1-C0, ADC1-C1, ADC1-C2, . . . are respectively connected to bit-input wirings ADC1-BIT0, ADC1-BIT1, ADC1-BIT2, . . . on the third metal layer L13. The attenuation capacitor ADC1-Ch is connected to the ground wiring ADC1-GND on the third metal layer L13.

Each of the DAC capacitor group ADC2-C0, . . . , ADC2-C7 and the attenuation capacitor ADC2-Ch of the second successive approximation type A/D converter ADC2 is formed by arranging and integrating unit capacitors Cu in the horizontal direction (the direction X in the drawing) on the fifth metal layer L15. Although only the DAC capacitors ADC2-C0, ADC2-C1, and ADC2-C2 are illustrated as the DAC capacitor group in the drawing, the DAC capacitor group actually includes DAC capacitors ADC2-C0, . . . , ADC2-C7. The DAC capacitors ADC2-C0, ADC2-C1, ADC2-C2, . . . are respectively connected to bit-input wirings ADC2-BIT0, ADC2-BIT1, ADC2-BIT2, . . . on the sixth metal layer L16. The attenuation capacitor ADC2-Ch is connected to the ground wiring ADC2-GND on the sixth metal layer L16.

In addition, the first metal layer L11 that is the GND plane, the ground wiring ADC1-GND on the third metal layer L13, the fourth metal layer L14 that is the GND plane, and the ground wiring ADC2-GND on the sixth metal layer L16 may be connected through a through hole formed in each metal layer.

In order to prevent interference between the first successive approximation type A/D converter ADC1 and the second successive approximation type A/D converter ADC2, the fourth metal layer L14 that is a GND plane is disposed between the first successive approximation type A/D converter ADC1 and the second successive approximation type A/D converter ADC2. By employing the configuration described above, in the successive approximation type A/D converter according to the first embodiment, the first successive approximation type A/D converter ADC1 and the second successive approximation type A/D converter ADC2 are formed in different wiring layers and are disposed to overlap each other in the vertical direction (stacking direction).

Figure 3:
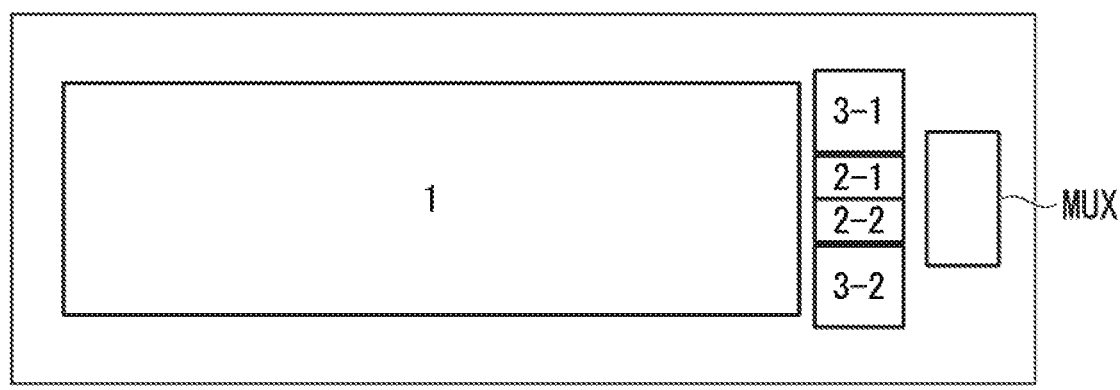
FIG. 3 is a diagram illustrating an example of layout design of a DAC capacitor group and an attenuation capacitor in a successive approximation type A/D converter according to the first embodiment of the present invention.

FIG. 3 is a diagram illustrating an example of layout design of the successive approximation type A/D converter according to the first embodiment. As illustrated in FIG. 3, on the layout, a capacitor network 1 including sample hold circuits 11 and capacitive DAC circuits 12 of the first successive approximation type A/D converter ADC1 and second successive approximation type A/D converter ADC2, a comparator 2-1 of the first successive approximation type A/D converter ADC1, a comparator 2-2 of the second successive approximation type A/D converter ADC2, a successive approximation logic circuit 3-1 of the first successive approximation type A/D converter ADC1, a successive approximation logic circuit 3-2 of the second successive approximation type A/D converter ADC2, and a multiplexer MUX are disposed.

Figure 21:
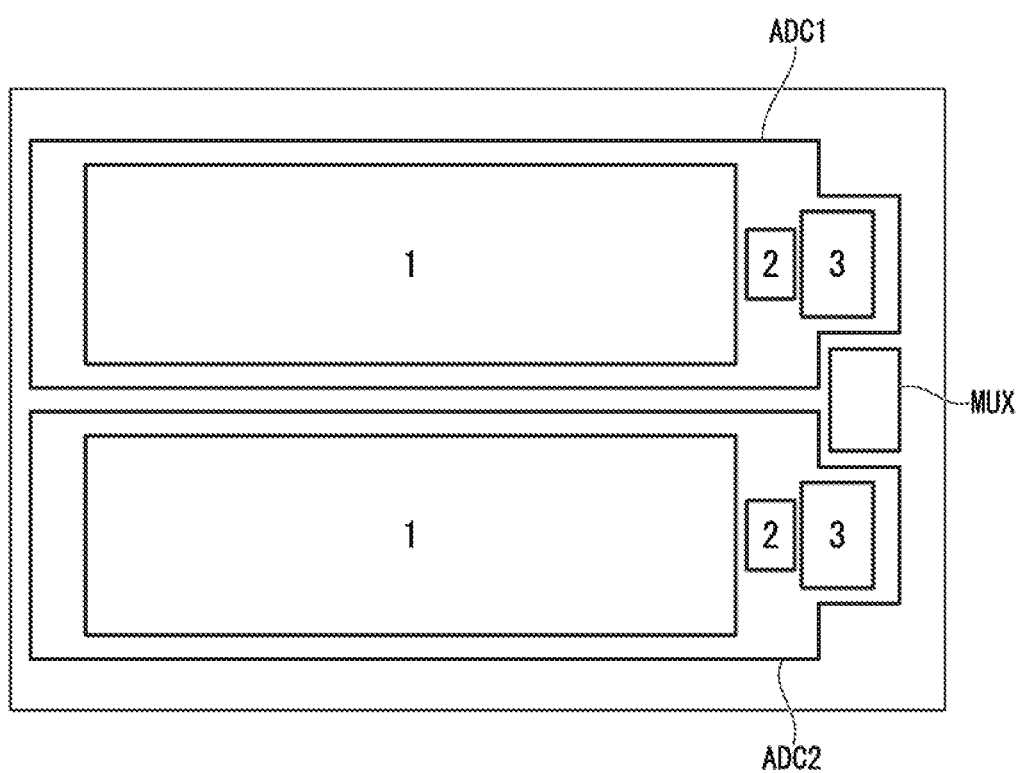
FIG. 21 is a top view illustrating a layout of a successive approximation type A/D converter of a two-channel interleave type according to a conventional technology.

As can be understood from FIG. 3, by configuring the DAC capacitors and the attenuation capacitors of the first successive approximation type A/D converter ADC1 and the second successive approximation type A/D converter ADC2 to be stacked to overlap each other, the chip area of the DAC capacitor group and the attenuation capacitor corresponding to one A/D converter can be reduced. The chip area occupied by the comparators 2-1 and 2-2, the successive approximation logic circuits 3-1 and 3-2, and the multiplexer MUX is almost the same as that of a successive approximation type A/D converter according to a conventional technology illustrated in FIG. 21.

In a successive approximation type A/D converter, a capacitive DAC circuit configured of a DAC capacitor group and an attenuation capacitor occupies most of the chip area. For this reason, in the successive approximation type A/D converter according to the first embodiment, by cutting down the chip area of the DAC capacitor group and the attenuation capacitor corresponding to one A/D converter, the chip area is almost half of the chip area of the successive approximation type A/D converter according to the conventional technology illustrated in FIG. 21.

Meanwhile, since MOM capacitors configuring the DAC capacitor group and the attenuation capacitor of the first successive approximation type A/D converter ADC1 and MOM capacitors configuring the DAC capacitor group and the attenuation capacitor of the second successive approximation type A/D converter ADC2 are built in different metal layers, even in a case in which the MOM capacitors are manufactured in the same size, there are cases in which capacitance values (unit capacitance values) thereof are different from each other. However, each successive approximation type A/D converter operates independently. In addition, in the successive approximation type A/D converter, in a case in which relative accuracy of each DAC capacitor that is binary-weighted and the attenuation capacitor is secured, the accuracy of an A/D conversion can be sufficiently secured. Thus, the MOM capacitors configuring the DAC capacitor group and the attenuation capacitor of each successive approximation type A/D converter are configured using the same metal layer, and accordingly, the relative accuracy of the A/D conversion can be sufficiently secured.

As described above, according to the first embodiment, a successive approximation type A/D converter of high resolution, high speed, and high accuracy having a small conversion error can be realized with a small chip area.

Second Embodiment

A successive approximation type A/D converter according to a second embodiment of the present invention will be described. According to the second embodiment, in the successive approximation type A/D converter as a single body, unlike a conventional technology, a layer configuring a DAC capacitor group C0 to C7 and a layer configuring an attenuation capacitor Ch are stacked to overlap each other.

Figure 4:
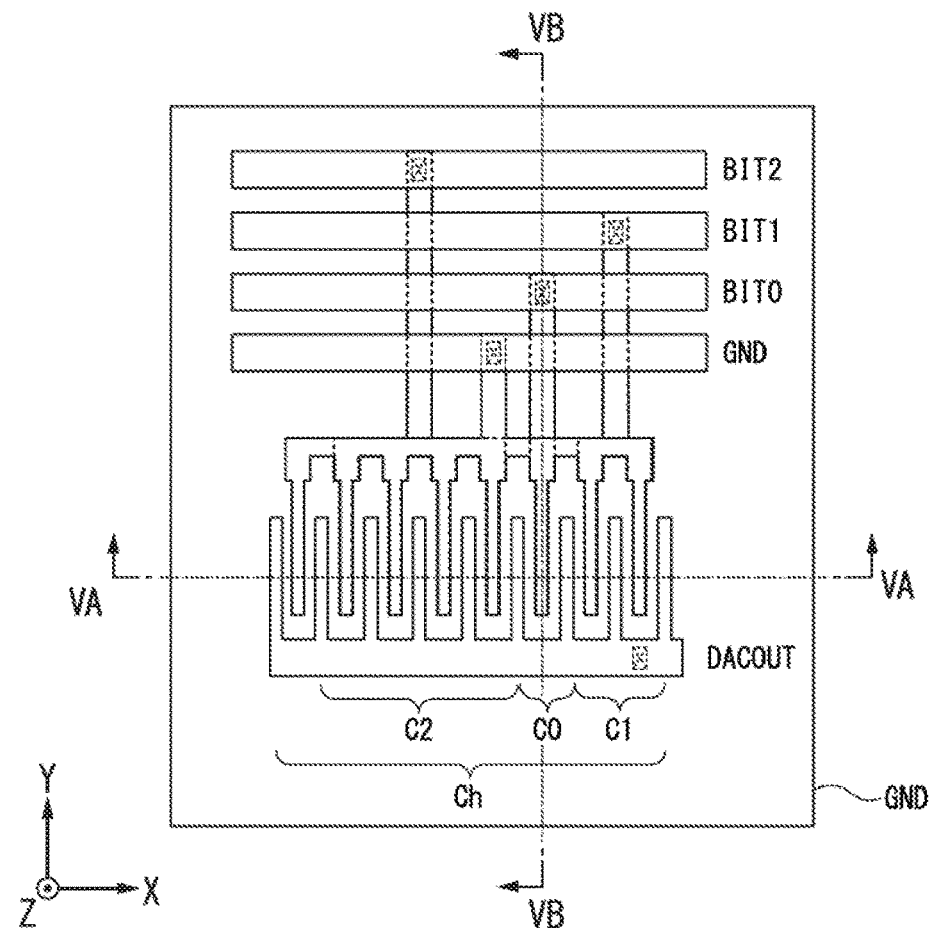
FIG. 4 is a top view illustrating the layout of a DAC capacitor group and an attenuation capacitor in a successive approximation type A/D converter according to a second embodiment of the present invention.
Figure 5A:
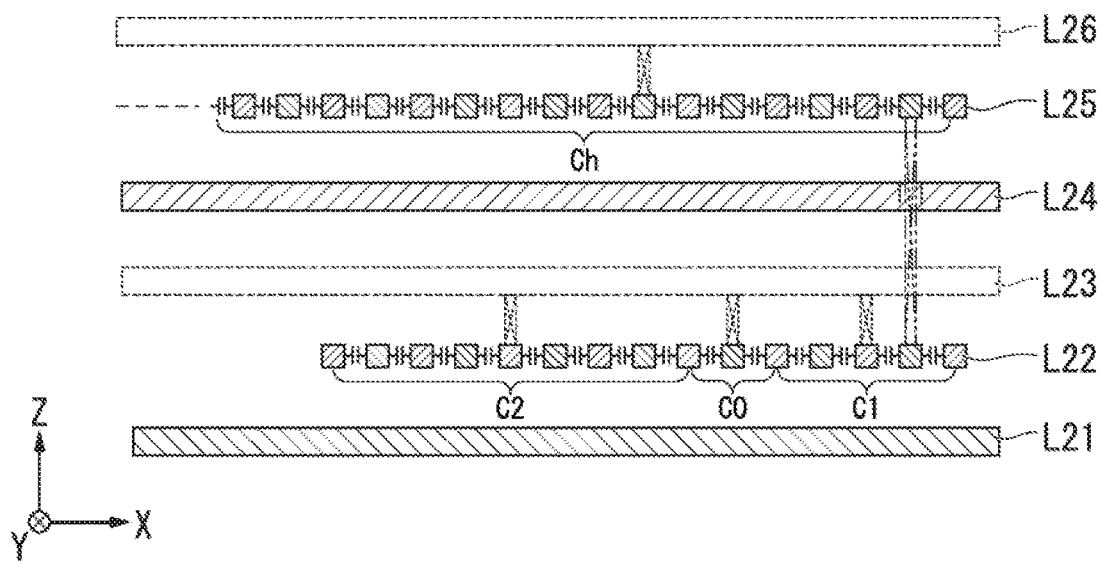
FIG. 5A is a cross-sectional view taken along line VA-VA illustrated in FIG. 4.
Figure 5B:
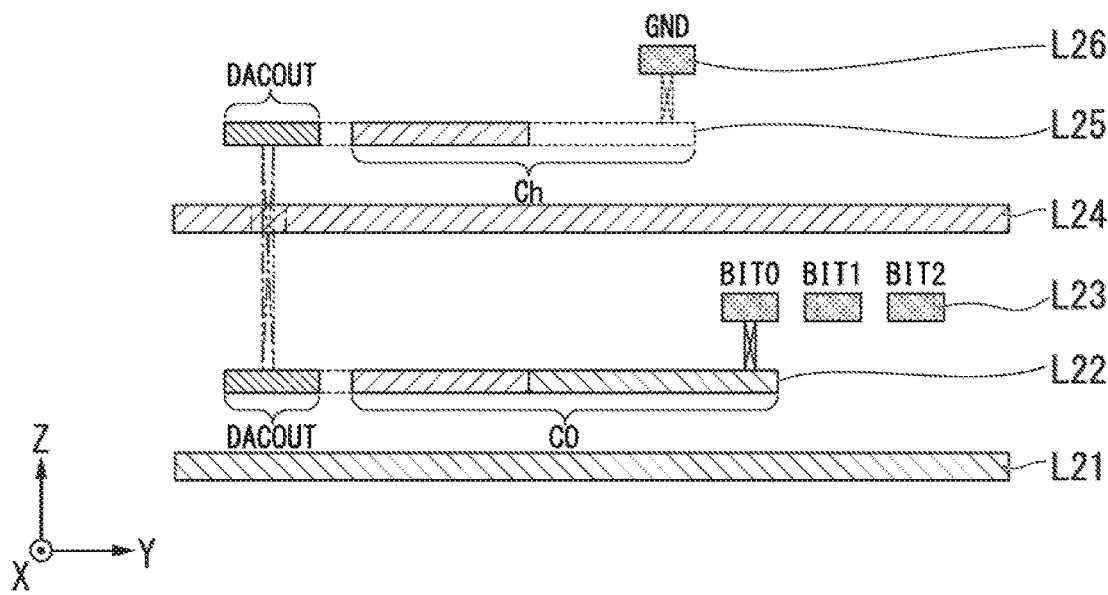
FIG. 5B is a cross-sectional view taken along line VB-VB illustrated in FIG. 4.

FIG. 4 is a top view illustrating the layout of a DAC capacitor group (first capacitor group) and attenuation capacitors (second capacitor group) of a capacitive DAC circuit of the successive approximation type A/D converter according to the second embodiment of the present invention. FIG. 5A is a cross-sectional view taken along line VA-VA illustrated in FIG. 4, and FIG. 5B is a cross-sectional view taken along line VB-VB illustrated in FIG. 4. In addition, a configuration that is not on a cross-section but would be visible from a side face is represented using broken lines in the drawing. The successive approximation type A/D converter according to the second embodiment, as illustrated in FIGS. 4, 5A, and 5B, is formed of six layers (a first metal layer L21, a second metal layer L22, a third metal layer L23, a fourth metal layer L24, a fifth metal layer L25, and a sixth metal layer L26).

More specifically, on the first metal layer L21 that is a GND plane for shielding, the second metal layer (first wiring layer) L22 configuring a DAC capacitor group (first capacitor group) C0 to C7 and a common electrode wiring DACOUT is formed. On the second metal layer L22, the third metal layer L23 configuring bit-input wirings BIT0 to BIT7 respectively connected to the DAC capacitor group C0 to C7 is formed.

On the third metal layer L23, the fourth metal layer (third wiring layer) L24 that is a GND plane for shielding is formed. On the fourth metal layer L24, the fifth metal layer (second wiring layer) L25 configuring attenuation capacitors (second capacitor group) Ch and a common electrode wiring DACOUT is formed. On the fifth metal layer L25, the sixth metal layer L26 configuring a ground wiring GND connected to the attenuation capacitors Ch is formed.

Each of the DAC capacitor group C0 to C7 is formed by arranging and integrating unit capacitors Cu on the second metal layer L22 in a horizontal direction (a direction X in the drawing). In the drawing, although only DAC capacitors C0, C1, and C2 are illustrated as the DAC capacitor group, actually, there are DAC capacitors C0 to C7 as the DAC capacitor group. The DAC capacitors C0, C1, C2, . . . are respectively connected to bit-input wirings BIT0, BIT1, BIT2, . . . on the third metal layer L23.

The attenuation capacitor Ch is formed by arranging and integrating unit capacitors Cu on the fifth metal layer L25 in the horizontal direction (the direction X in the drawing). The attenuation capacitor Ch is connected to the ground wiring GND on the sixth metal layer L26. In addition, the common electrode wiring DACOUT on the second metal layer L22 and the common electrode wiring DACOUT on the fifth metal layer L25 are connected through a through hole formed in the third metal layer L23 and the fourth metal layer L24.

Furthermore, the fourth metal layer L24 that is a GND plane and the ground wiring GND of the sixth metal layer L26 may be connected through a through hole formed in the fifth metal layer L25. In addition, the first metal layer L21 that is a GND plane and the fourth metal layer L24 that is a GND plane may be connected through a through hole formed in the second metal layer L22 and the third metal layer L23. Furthermore, the first metal layer L21 that is a GND plane and the ground wiring GND of the sixth metal layer L26 may be connected through a through hole formed in the second metal layer L22, the third metal layer L23, the fourth metal layer L24, and the fifth metal layer L25. In addition, the first metal layer L21 that is a GND plane, the fourth metal layer L24 that is a GND plane, and the ground wiring GND of the sixth metal layer L26 may be connected through a through hole formed in the second metal layer L22, the third metal layer L23, the fourth metal layer L24, and the fifth metal layer L25.

A differential-input dynamic range Vfs,pp of the successive approximation type A/D converter is given in the following Equation (3) in an ideal situation in which parasitic capacitance and the like are not present. In Equation (3), Cdac represents a total of capacitance values of the DAC capacitor group C0 to C7, Ch represents a capacitance value of the attenuation capacitor, VDD represents a power source voltage of the DAC driver, and k is a coefficient.

$$V_{fs,pp} = 2\frac{Cdac}{Cdac + Ch}VDD = kVDD \quad (3)$$

Here, the capacitance value Ch of the attenuation capacitor is set such that the capacitance value Ch of the attenuation capacitor is the same as the total Cdac of the capacitance values of the DAC capacitor group C0 to C7. In other words, when Ch is set such that Ch=Cdac, the differential-input dynamic range Vfs,pp and the coefficient k are given in the following Equation (4).

$$\left. \begin{array}{c} V_{fs,pp} = VDD \\ k = 2\frac{Cdac}{Cdac + Ch} = 1 \end{array} \right\} \quad (4)$$

In a case in which Equation (4) is satisfied, in other words, in a case in which the coefficient k is "1," and the capacitance value Ch of the attenuation capacitor is the same as the total Cdac of the capacitance values of the DAC capacitor group C0 to C7, the dynamic range (differential-input dynamic range) for a differential-input signal becomes a full-scale range corresponding to the power source voltage VDD of the DAC driver.

Since MOM capacitors configuring the DAC capacitor group C0 to C7 and the attenuation capacitor Ch are built in different metal layers, even in a case in which the MOM capacitors are manufactured in the same size, there are cases in which capacitance values (unit capacitance values) thereof are different from each other. For this reason, there is concern that the dynamic range slight deviates from a designed value.

Meanwhile, the linearity is determined based on relative accuracy between DAC capacitors, and thus, when the relative accuracy between the DAC capacitors is secured, the linearity of an A/D conversion can be sufficiently secured. Thus, since the MOM capacitors configuring the DAC capacitor group C0 to C7 are configured using the same metal layer, the linearity of the A/D conversion can be sufficiently secured, and the accuracy of the A/D conversion can be sufficiently secured. In addition, in order to correct an error in the dynamic range, some of the attenuation capacitors Ch may be configured to be changeable (the number of parallel connections of MOM capacitors are changed), and the attenuation capacitors Ch may be adjusted such that Vfs,pp=VDD (k=1).

As described above, according to the second embodiment, the capacitive DAC circuit is configured of stacking the layer configuring the DAC capacitor group C0 to C7 and the layer configuring the attenuation capacitors Ch to overlap each other. Accordingly, the chip area can be configured to be almost half of that of the capacitive DAC circuit according to a conventional technology, and the chip area of the successive approximation type A/D converter can be significantly decreased. In other words, according to the second embodiment, a successive approximation type A/D converter having high resolution and good linearity can be realized with a small chip area.

Third Embodiment

A successive approximation type A/D converter according to a third embodiment of the present invention will be described. According to the third embodiment, the bit-input wirings ADC1-BIT0, . . . , ADC1-BIT7 and the ground wiring ADC1-GND of the first successive approximation type A/D converter ADC1 and the bit-input wirings ADC2-BIT0, . . . , ADC2-BIT7 and the ground wiring ADC2-GND of the capacitive DAC of the second successive approximation type A/D converter ADC2 of the successive approximation type A/D converter according to the first embodiment are generated on the same metal layer. Accordingly, in the successive approximation type A/D converter according to the third embodiment, compared to the successive approximation type A/D converter according to the first embodiment, the number of metal layers is reduced by one.

Figure 6:
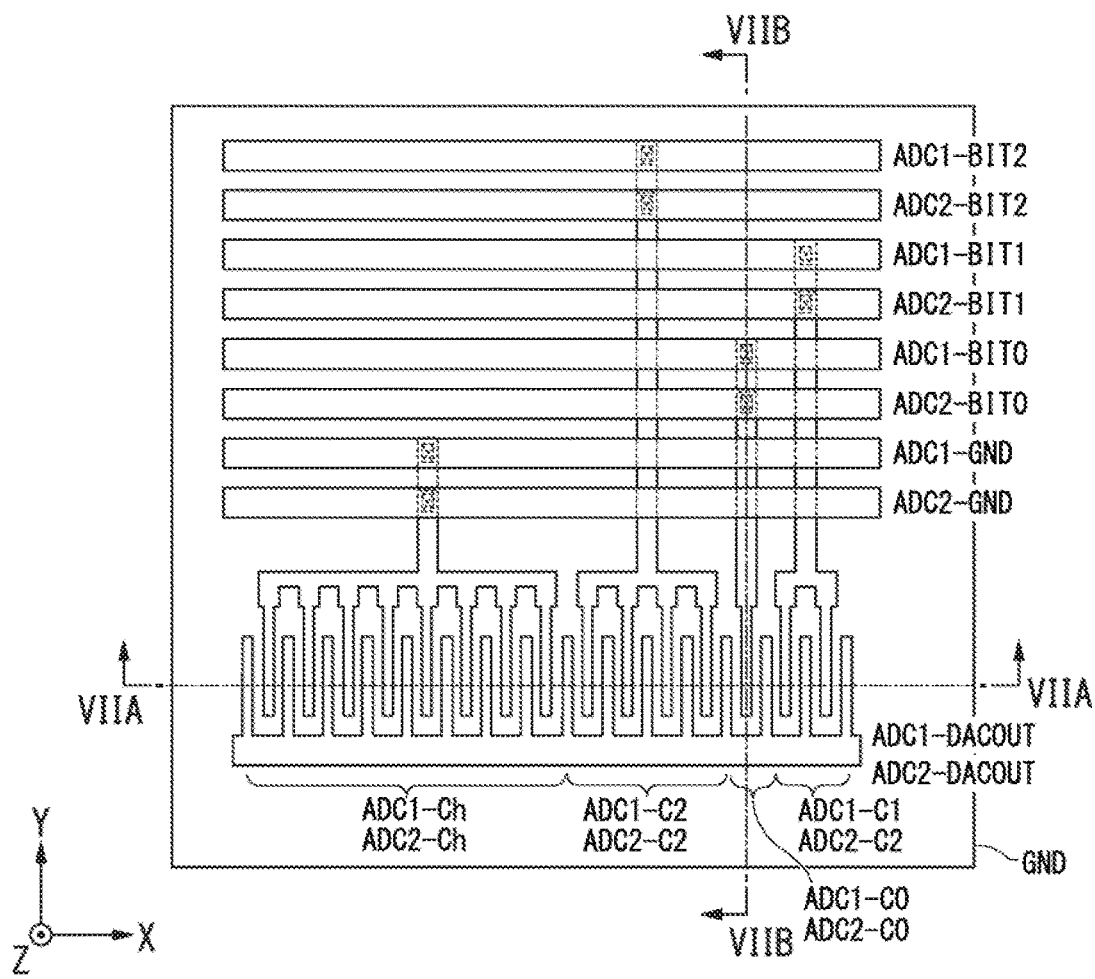
FIG. 6 is a top view illustrating the layout of a DAC capacitor group and an attenuation capacitor in a successive approximation type A/D converter according to a third embodiment of the present invention.
Figure 7A:
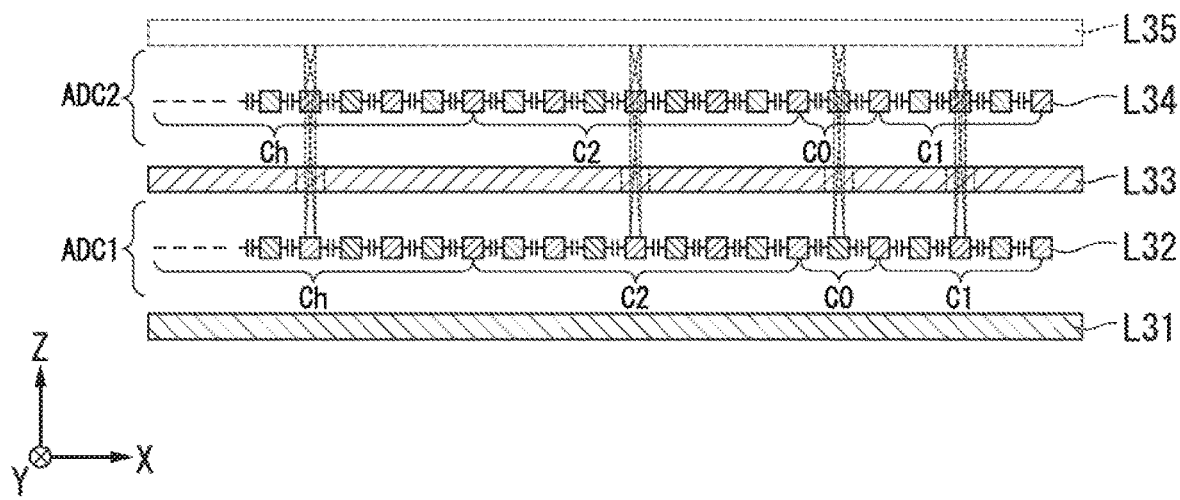
FIG. 7A is a cross-sectional view taken along line VIIA-VIIA illustrated in FIG. 6.
Figure 7B:
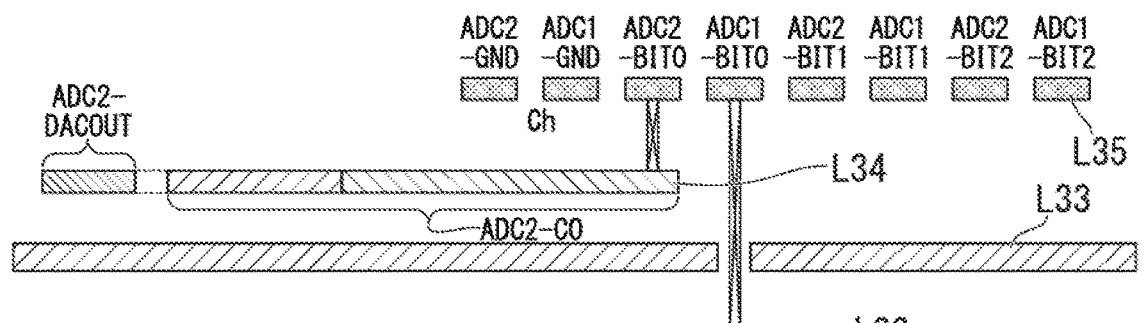
FIG. 7B is a cross-sectional view taken along line VIIB-VIIB illustrated in FIG. 6.

FIG. 6 is a top view illustrating the layout of a DAC capacitor group and an attenuation capacitor in a stacked capacitive DAC circuit of the successive approximation type A/D converter according to the third embodiment of the present invention. FIG. 7A is a cross-sectional view taken along line VIIA-VIIA illustrated in FIG. 6, and FIG. 7B is a cross-sectional view taken along line VIIB-VIIB illustrated in FIG. 6. In addition, a configuration that is not on a cross-section but would be visible from a side face is represented using broken lines in the drawing. The successive approximation type A/D converter according to the third embodiment, as illustrated in FIGS. 6, 7A, and 7B, is formed of five layers (a first metal layer L31, a second metal layer L32, a third metal layer L33, a fourth metal layer L34, and a fifth metal layer L35).

More specifically, on the first metal layer L31 that is a GND plane for shielding, the second metal layer (first wiring layer) L32 configuring a DAC capacitor group (first capacitor group) and attenuation capacitors (second capacitor group) that are MOM capacitors of a first successive approximation type A/D converter ADC1 and a common electrode wiring ADC1-DACOUT of the first successive approximation type A/D converter ADC1 is formed. On the second metal layer L32, the third metal layer (third wiring layer) L33 that is a GND plane for shielding is formed.

On the third metal layer L33, the fourth metal layer (second wiring layer) L34 configuring a DAC capacitor group (third capacitor group) and attenuation capacitors (fourth capacitor group) that are MOM capacitors of a second successive approximation type A/D converter ADC2 and a common electrode wiring ADC2-DACOUT of the second successive approximation type A/D converter ADC2 is formed. On the fourth metal layer L34, the fifth metal layer L35 configuring bit-input wirings ADC1-BIT0, . . . , ADC1-BIT7 and a ground wiring ADC1-GND of the first successive approximation type A/D converter ADC1 and bit-input wirings ADC2-BIT0, . . . , ADC2-BIT7 and a ground wiring ADC2-GND of the second successive approximation type A/D converter ADC2 is formed.

Each of the DAC capacitor group ADC1-C0, . . . , ADC1-C7 and the attenuation capacitor ADC1-Ch of the first successive approximation type A/D converter ADC1 is formed by arranging and integrating unit capacitors ADC1-Cu on the second metal layer L32 in a horizontal direction (a direction X in the drawing). In the drawing, although only DAC capacitors ADC1-C0, ADC1-C1 and ADC1-C2 are illustrated as the DAC capacitor group, actually, there are DAC capacitors ADC1-C0, . . . , ADC1-C7 as the DAC capacitor group. The DAC capacitors ADC1-C0, ADC1-C1, ADC1-C2, . . . of the first successive approximation type A/D converter ADC1 are respectively connected to bit-input wirings ADC1-BIT0, ADC1-BIT1, ADC1-BIT2, . . . on the fifth metal layer L35. The attenuation capacitor ADC1-Ch of the first successive approximation type A/D converter ADC1 is connected to a ground wiring ADC1-GND on the fifth metal layer L35.

Here, the DAC capacitors ADC1-C0, ADC1-C1, ADC1-C2, . . . and the bit-input wirings ADC1-BIT0, ADC1-BIT1, ADC1-BIT2, . . . of the first successive approximation type A/D converter ADC1 may be connected through a through hole formed in the third metal layer L33 and the fourth metal layer L34. In addition, the attenuation capacitor ADC1-Ch and the ground wiring ADC1-GND of the first successive approximation type A/D converter ADC1 may be connected through a through hole formed in the third metal layer L33 and the fourth metal layer L34.

Each of the DAC capacitor group ADC2-C0, . . . , ADC2-C7 and the attenuation capacitor ADC2-Ch of the second successive approximation type A/D converter ADC2 is formed by arranging and integrating unit capacitors Cu on the fourth metal layer L34 in a horizontal direction (the direction X in the drawing). In the drawing, although only DAC capacitors ADC2-C0, ADC2-C1 and ADC2-C2 are illustrated as the DAC capacitor group, actually, there are DAC capacitors ADC2-C0, . . . , ADC2-C7 as the DAC capacitor group. The DAC capacitors ADC2-C0, ADC2-C1, ADC2-C2, . . . of the second successive approximation type A/D converter ADC2 are respectively connected to bit-input wirings ADC2-BIT0, ADC2-BIT1, ADC2-BIT2, . . . on the fifth metal layer L35. The attenuation capacitor ADC2-Ch of the second successive approximation type A/D converter ADC2 is connected to a ground wiring ADC2-GND on the fifth metal layer L35.

In addition, the ground wirings ADC1-GND and ADC2-GND on the first metal layer L31, the third metal layer L33, and the fifth metal layer L35 that are GND planes may be connected through a through hole formed in each metal layer.

In order to prevent interference between the first successive approximation type A/D converter ADC1 and the second successive approximation type A/D converter ADC2, the third metal layer L33 that is a GND plane is disposed between the first successive approximation type A/D converter ADC1 and the second successive approximation type A/D converter ADC2. By employing the configuration described above, in the successive approximation type A/D converter according to the third embodiment, similar to the successive approximation type A/D converter according to the first embodiment, the first successive approximation type A/D converter ADC1 and the second successive approximation type A/D converter ADC2 are formed in different wiring layers and are disposed to overlap each other in the vertical direction (stacking direction).

The operations and the effects of the successive approximation type A/D converter according to the third embodiment are similar to the operations and the effects of the successive approximation type A/D converter according to the first embodiment. In other words, in the successive approximation type A/D converter according to the third embodiment, by cutting down the chip area of the DAC capacitor group and the attenuation capacitor corresponding to one A/D converter, similar to the successive approximation type A/D converter according to the first embodiment, the chip area is almost half of the chip area of the successive approximation type A/D converter according to the conventional technology illustrated in FIG. 21.

In addition, in the successive approximation type A/D converter according to the third embodiment, compared to the successive approximation type A/D converter according to the first embodiment, the number of metal layers is reduced by one. Accordingly, the successive approximation type A/D converter according to the third embodiment realizes a successive approximation type A/D converter, of which the size is further decreased, reducing the manufacturing cost.

As described above, according to the third embodiment, a successive approximation type A/D converter, of which the manufacturing cost is reduced, having high resolution, high speed, high accuracy and a small conversion error can be realized with a small chip area.

Fourth Embodiment

A successive approximation type A/D converter according to a fourth embodiment of the present invention will be described. In the fourth embodiment, the ground wiring GND connected to the attenuation capacitor Ch of the successive approximation type A/D converter according to the second embodiment is commonly used as a metal layer that is a GND plane for shielding. Accordingly, in the successive approximation type A/D converter according to the fourth embodiment, compared to the successive approximation type A/D converter according to the second embodiment, the number of metal layers is reduced by one.

Figure 8:
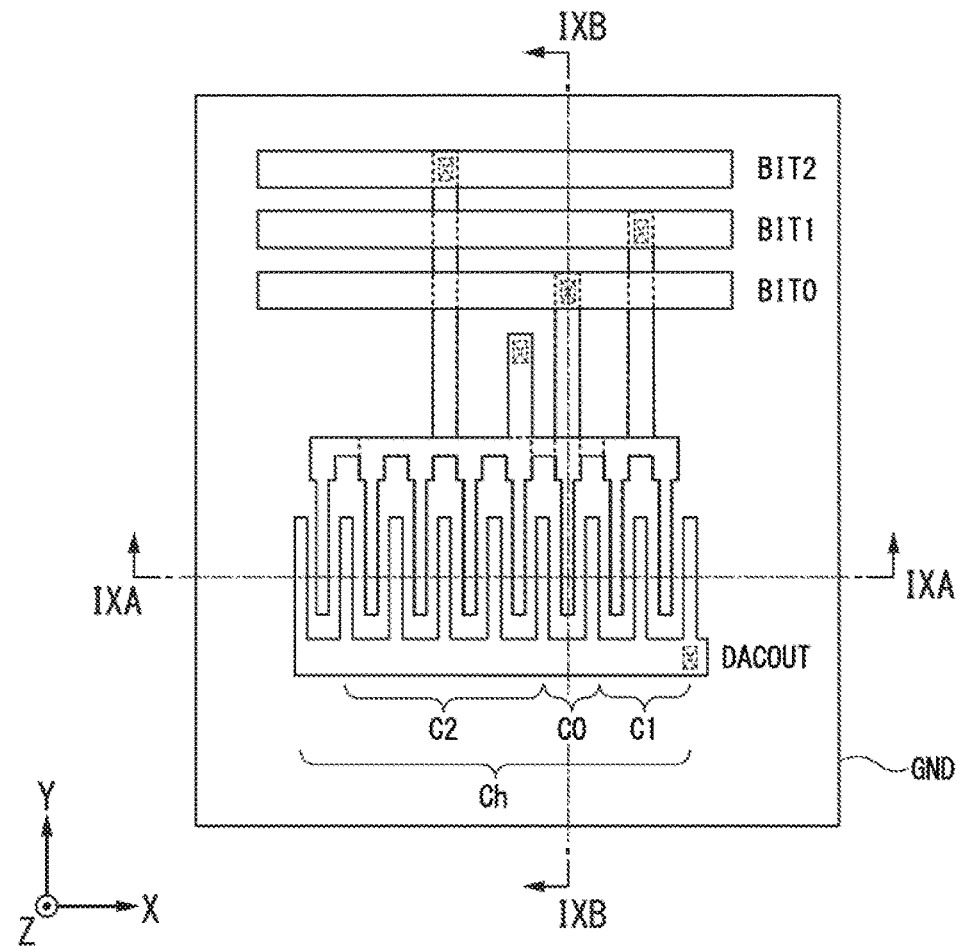
FIG. 8 is a top view illustrating the layout of a DAC capacitor group and an attenuation capacitor in a successive approximation type A/D converter according to a fourth embodiment of the present invention.
Figure 9A:
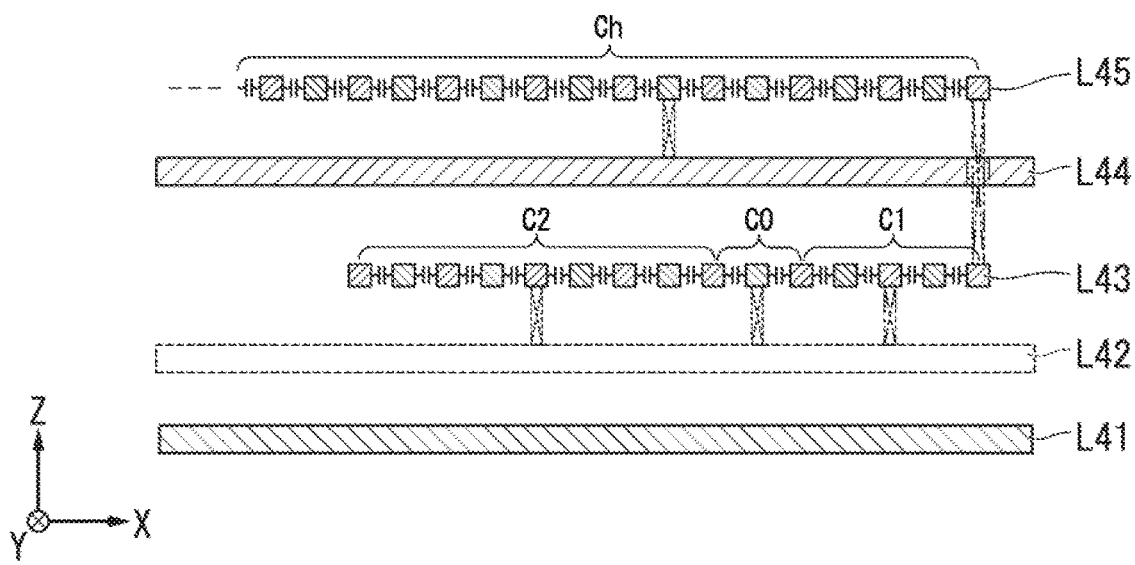
FIG. 9A is a cross-sectional view taken along line IXA-IXA illustrated in FIG. 8.
Figure 9B:
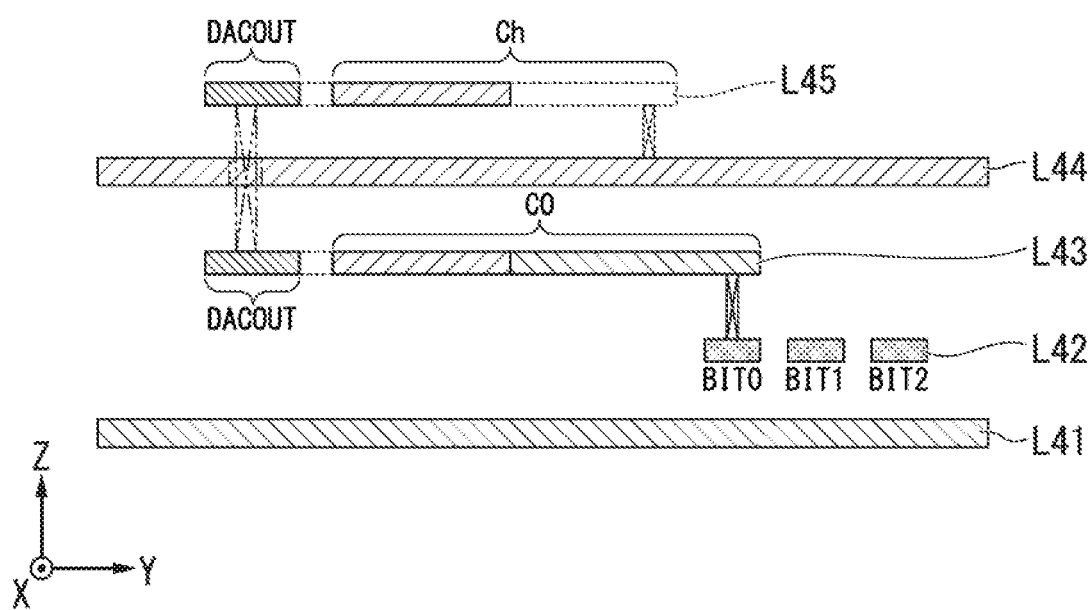
FIG. 9B is a cross-sectional view taken along line IXB-IXB illustrated in FIG. 8.

FIG. 8 is a top view illustrating the layout of a DAC capacitor group (first capacitor group) and attenuation capacitors (second capacitor group) in the capacitive DAC circuit of the successive approximation type A/D converter according to the fourth embodiment of the present invention. FIG. 9A is a cross-sectional view taken along line IXA-IXA illustrated in FIG. 8, and FIG. 9B is a cross-sectional view taken along line IXB-IXB illustrated in FIG. 8. In addition, a configuration that is not on a cross-section but would be visible from a side face is represented using broken lines in the drawing. The successive approximation type A/D converter according to the fourth embodiment, as illustrated in FIGS. 8, 9A, and 9B, is formed of five layers (a first metal layer L41, a second metal layer L42, a third metal layer L43, a fourth metal layer L44, and a fifth metal layer L45).

More specifically, on the first metal layer L41 that is a GND plane for shielding, the second metal layer L42 configuring bit-input wirings BIT0 to BIT7 of a DAC capacitor group C0 to C7 is formed. On the second metal layer L42, the third metal layer (first wiring layer) L43 configuring the DAC capacitor group (first capacitor group) C0 to C7 and a common electrode wiring DACOUT is formed.

On the third metal layer L43, the fourth metal layer (third wiring layer) L44 that is a GND plane for shielding is formed. Here, the fourth metal layer L44 is commonly used as a ground wiring GND connected to the attenuation capacitor Ch. On the fourth metal layer L44, the fifth metal layer (second wiring layer) L45 configuring attenuation capacitors (second capacitor group) Ch and a common electrode wiring DACOUT is formed.

Each of the DAC capacitor group C0 to C7 is formed by arranging and integrating unit capacitors Cu on the third metal layer L43 in a horizontal direction (a direction X illustrated in the drawing). In the drawing, although only DAC capacitors C0, C1, and C2 are illustrated as the DAC capacitor group, actually, there are DAC capacitors C0 to C7 as the DAC capacitor group. The DAC capacitors C0, C1, C2, . . . are respectively connected to bit-input wirings BIT0, BIT1, BIT2, . . . on the second metal layer L42.

The attenuation capacitor Ch is formed by arranging and integrating unit capacitors Cu on the fifth metal layer L45 in the horizontal direction (the direction X in the drawing). The attenuation capacitor Ch is connected to the fourth metal layer L44 (ground wiring GND). In addition, the common electrode wiring DACOUT on the third metal layer L43 and the common electrode wiring DACOUT on the fifth metal layer L45 may be connected through a through hole formed in the fourth metal layer L44. Furthermore, the first metal layer L41 and the fourth metal layer L44 that are GND planes may be connected through a through hole formed in the second metal layer L42 and the third metal layer L43.

The operations and the effects of the successive approximation type A/D converter according to the fourth embodiment are similar to the operations and the effects of the successive approximation type A/D converter according to the second embodiment. In other words, in the fourth embodiment, a capacitive DAC circuit is configured of stacking the layer configuring the DAC capacitor group C0 to C7 and the layer configuring the attenuation capacitors Ch to overlap each other. Accordingly, similar to the successive approximation type A/D converter according to the second embodiment, the chip area can be configured to be almost half of that of the capacitive DAC circuit according to a conventional technology, and the chip area of the successive approximation type A/D converter can be significantly decreased. In other words, according to the fourth embodiment, a successive approximation type A/D converter having high resolution and good linearity can be realized with a small chip area.

In addition, in the successive approximation type A/D converter according to the fourth embodiment, compared to the successive approximation type A/D converter according to the second embodiment, the number of metal layers is reduced by one. Accordingly, the successive approximation type A/D converter according to the fourth embodiment realizes a successive approximation type A/D converter, of which the size is further decreased, and thereby reduces the manufacturing cost.

Fifth Embodiment

A successive approximation type A/D converter according to a fifth embodiment of the present invention will be described. In the fifth embodiment, the ground wiring GND connected to the attenuation capacitor Ch of the successive approximation type A/D converter according to the second embodiment is commonly used as a metal layer that is a GND plane for shielding, and a metal layer configuring bit-input wirings BIT0 to BIT7 of the DAC capacitor group C0 to C7 and a metal layer configuring an attenuation capacitor Ch are configured as being the same layer. Accordingly, in the successive approximation type A/D converter according to the fifth embodiment, compared to the successive approximation type A/D converter according to the second embodiment, the number of metal layers is reduced by two.

Figure 10:
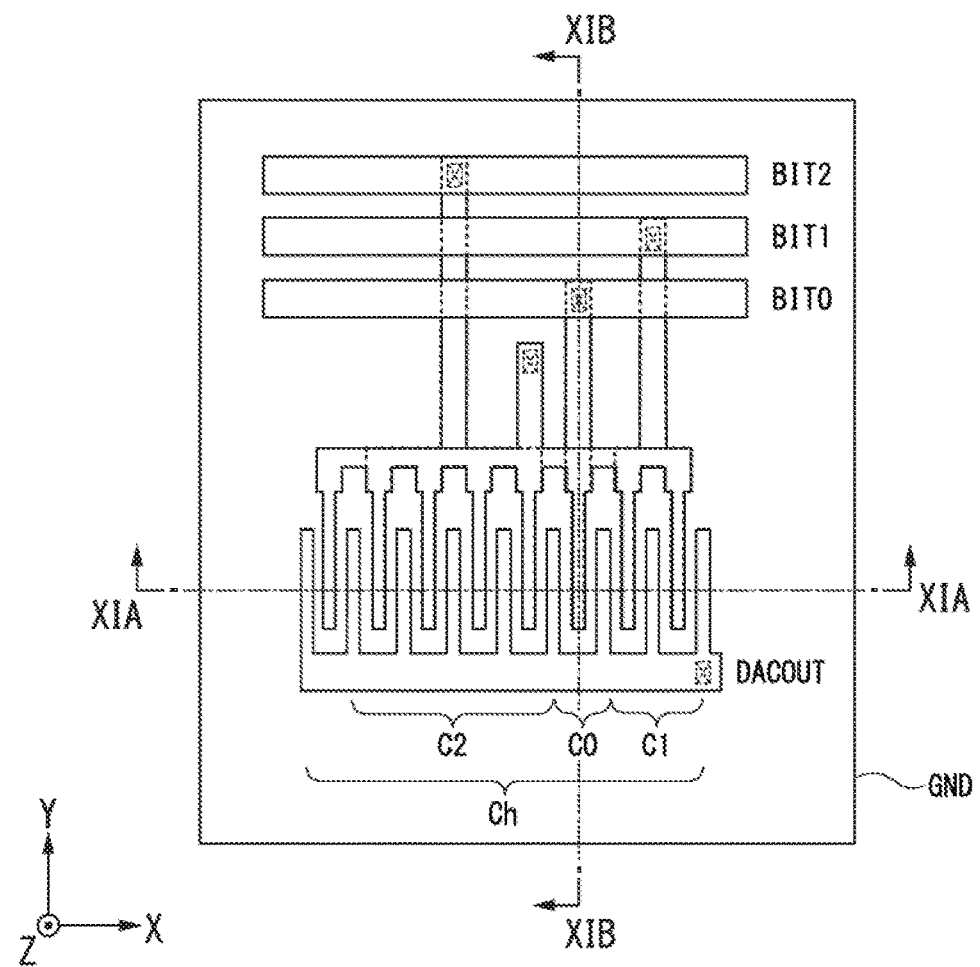
FIG. 10 is a top view illustrating the layout of a DAC capacitor group and an attenuation capacitor in a successive approximation type A/D converter according to a fifth embodiment of the present invention.
Figure 11A:
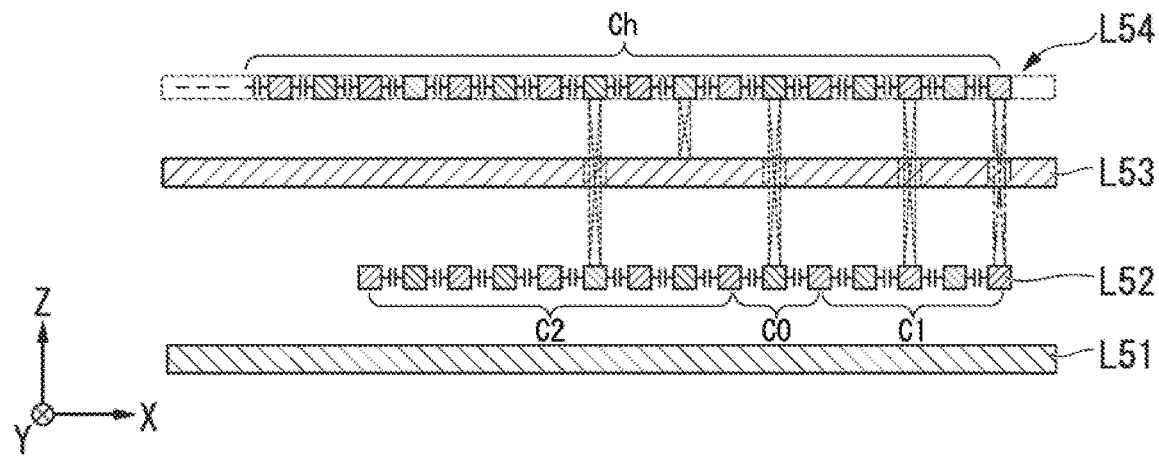
FIG. 11A is a cross-sectional view taken along line XIA-XIA illustrated in FIG. 10.
Figure 11B:
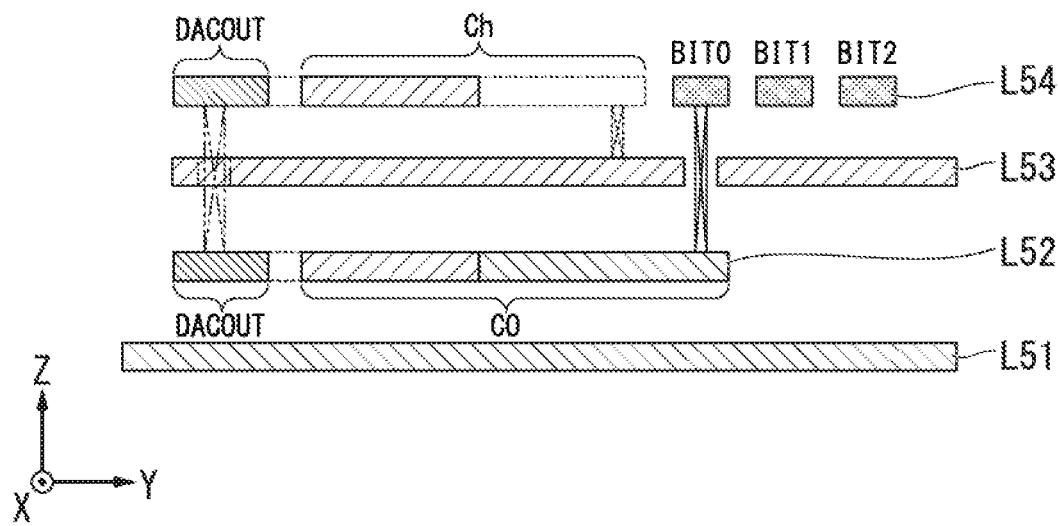
FIG. 11B is a cross-sectional view taken along line XIB-XIB illustrated in FIG. 10.

FIG. 10 is a top view illustrating the layout of a DAC capacitor group (first capacitor group) and an attenuation capacitor (second capacitor group) in a capacitive DAC circuit of a successive approximation type A/D converter according to the fifth embodiment of the present invention. FIG. 11A is a cross-sectional view taken along line XIA-XIA illustrated in FIG. 10, and FIG. 11B is a cross-sectional view taken along line XIB-XIB illustrated in FIG. 10. In addition, a configuration that is not on a cross-section but would be visible from a side face is represented using broken lines in the drawing. The successive approximation type A/D converter according to the fifth embodiment, as illustrated in FIGS. 10, 11A, and 11B, is formed of four layers (a first metal layer L51, a second metal layer L52, a third metal layer L53, and a fourth metal layer L54).

More specifically, on the first metal layer L51 that is a GND plane for shielding, the second metal layer (first wiring layer) L52 configuring the DAC capacitor group (first capacitor group) C0 to C7 and a common electrode wiring DACOUT is formed. On the second metal layer L52, the third metal layer (third wiring layer) L53 that is a GND plane for shielding is formed. Here, the third metal layer L53 is commonly used as a ground wiring GND connected to the attenuation capacitor Ch. On the third metal layer L53, the fourth metal layer (second wiring layer) L54 configuring the attenuation capacitor (second capacitor group) Ch and a common electrode wiring DACOUT is formed. Here, on the fourth metal layer L54, bit-input wirings BIT0 to BIT7 of the DAC capacitor group C0 to C7 are also formed.

Each of the DAC capacitor group C0 to C7 is formed by arranging and integrating unit capacitors Cu on the second metal layer L52 in a horizontal direction (a direction X illustrated in the drawing). In the drawing, although only DAC capacitors C0, C1, and C2 are illustrated as the DAC capacitor group, actually, there are DAC capacitors C0 to C7 as the DAC capacitor group. The DAC capacitors C0, C1, C2, . . . are respectively connected to bit-input wirings BIT0, BIT1, BIT2, . . . on the fourth metal layer L54. In addition, each of the DAC capacitors C0 to C7 on the second metal layer L52 and the bit-input wirings BIT0 to BIT7 on the fourth metal layer L54 may be connected through a through hole formed in the third metal layer L53.

The attenuation capacitor Ch is formed by arranging and integrating unit capacitors Cu on the fourth metal layer L54 in the horizontal direction (the direction X in the drawing). The attenuation capacitor Ch is connected to the third metal layer L53 (ground wiring GND). In addition, the first metal layer L51 and the third metal layer L53 that are GND planes may be connected through a through hole formed in the second metal layer L52.

The operations and the effects of the successive approximation type A/D converter according to the fifth embodiment are similar to the operations and the effects of the successive approximation type A/D converter according to the second embodiment and the successive approximation type A/D converter according to the fourth embodiment. In other words, in the fifth embodiment, a capacitive DAC circuit is configured of stacking the layer configuring the DAC capacitor group C0 to C7 and the layer configuring the attenuation capacitors Ch to overlap each other. Accordingly, similar to the successive approximation type A/D converter according to the second embodiment and the successive approximation type A/D converter according to the fourth embodiment, the chip area can be configured to be almost half of that of the capacitive DAC circuit according to a conventional technology, and the chip area of the successive approximation type A/D converter can be significantly decreased. In other words, according to the fifth embodiment, a successive approximation type A/D converter having high resolution and good linearity can be realized with a small chip area.

In addition, in the successive approximation type A/D converter according to the fifth embodiment, compared to the successive approximation type A/D converter according to the second embodiment, the number of metal layers is reduced by two. In the successive approximation type A/D converter according to the fifth embodiment, compared to the successive approximation type A/D converter according to the fourth embodiment, the number of metal layers is reduced by one. Accordingly, the successive approximation type A/D converter according to the fifth embodiment realizes a successive approximation type A/D converter, of which the size is further decreased, which further reduces the manufacturing cost.

Sixth Embodiment

A successive approximation type A/D converter according to a sixth embodiment of the present invention will be described. In the sixth embodiment, a metal layer configuring the bit-input wirings BIT0 to BIT7 of the DAC capacitor group C0 to C7 of the successive approximation type A/D converter according to the second embodiment, a metal layer configuring an attenuation capacitor Ch, and a metal layer configuring a ground wiring GND connected to the attenuation capacitor are configured as the same layer. Accordingly, in the successive approximation type A/D converter according to the sixth embodiment, compared to the successive approximation type A/D converter according to the second embodiment, the number of metal layers is reduced by two.

Figure 12:
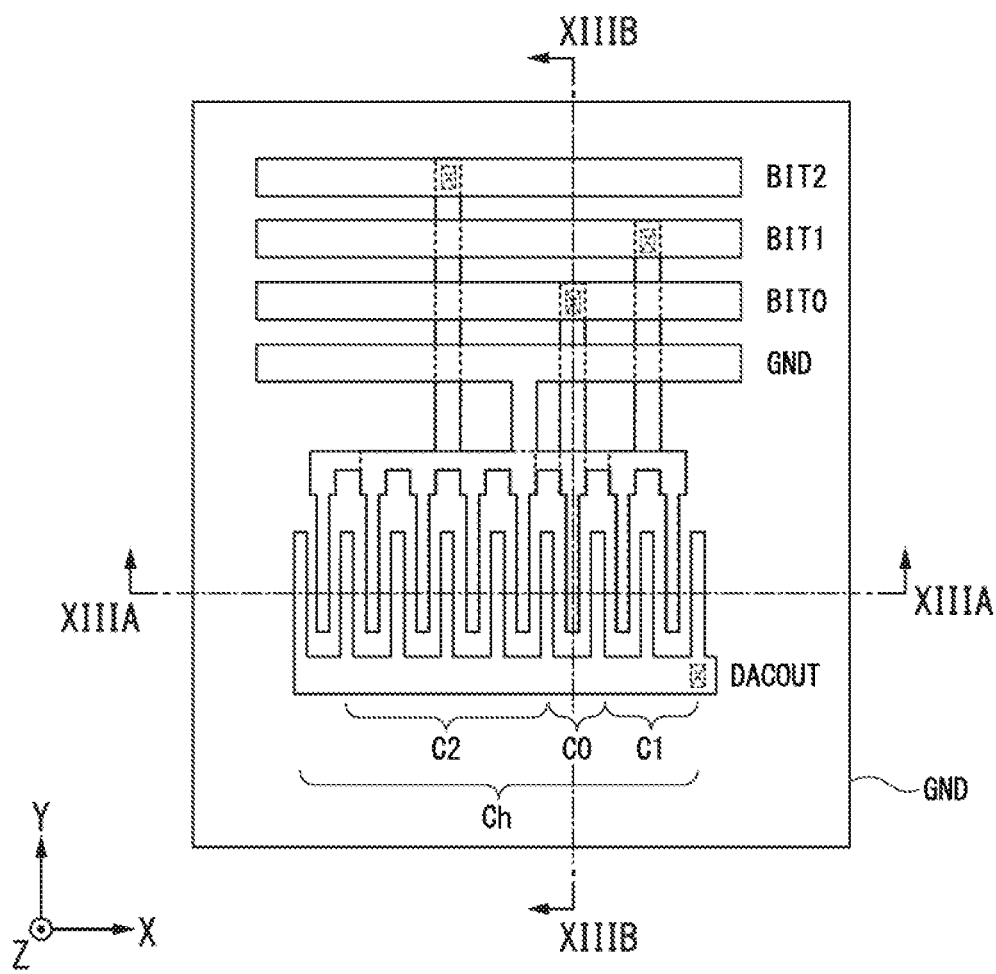
FIG. 12 is a top view illustrating the layout of a DAC capacitor group and an attenuation capacitor in a successive approximation type A/D converter according to a sixth embodiment of the present invention.
Figure 13A:
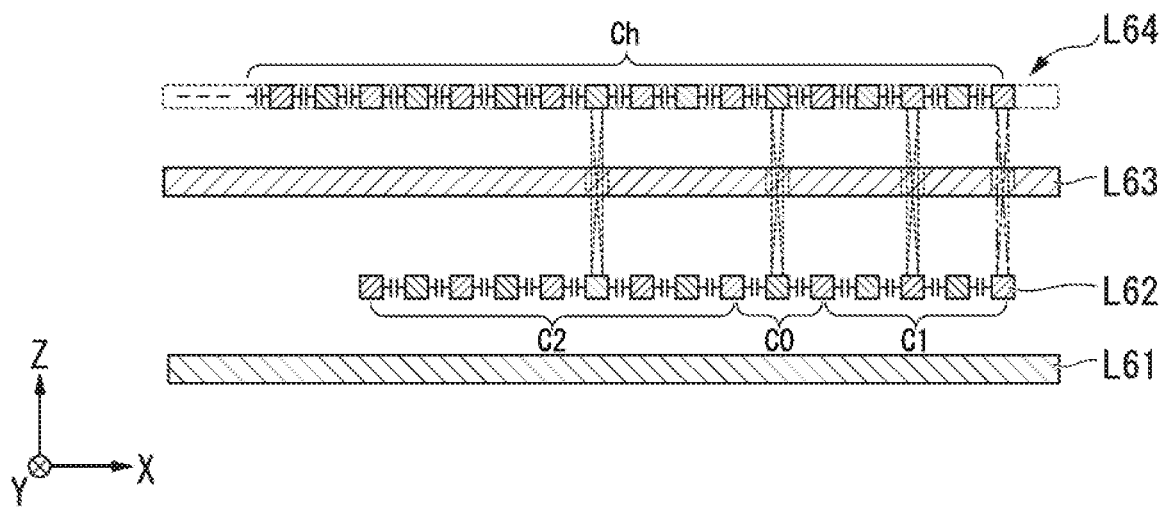
FIG. 13A is a cross-sectional view taken along line XIIIA-XIIIA illustrated in FIG. 12.
Figure 13B:
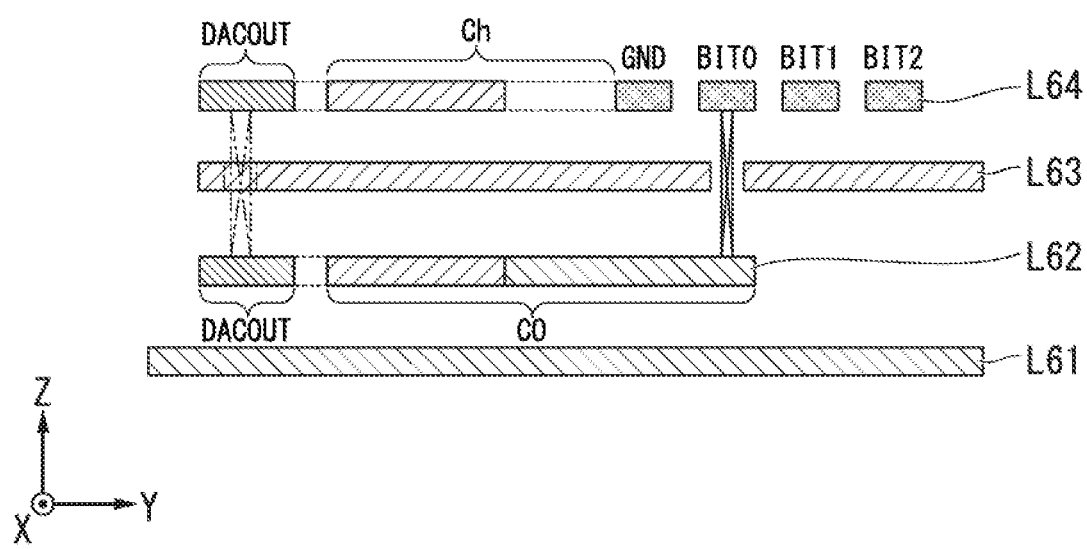
FIG. 13B is a cross-sectional view taken along line XIIIB-XIIIB illustrated in FIG. 12.
Figure 14:
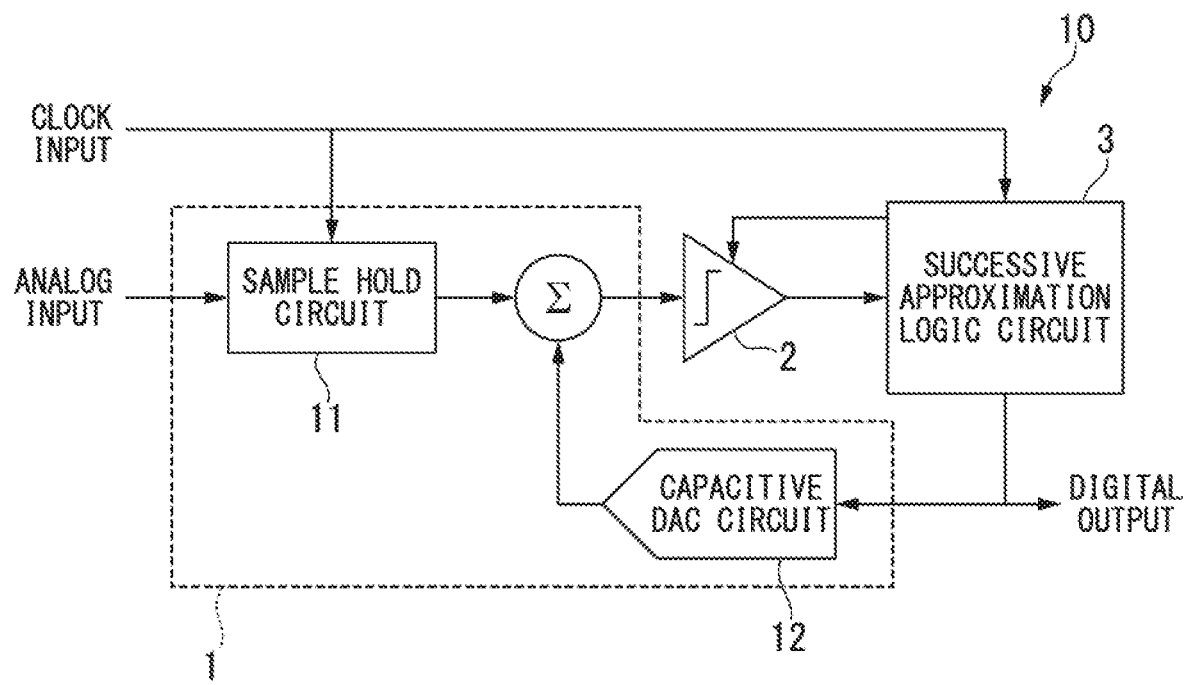
FIG. 14 is a block diagram illustrating the configuration of a successive approximation type A/D converter of differential-input asynchronous communication according to a conventional technology.
Figure 15:
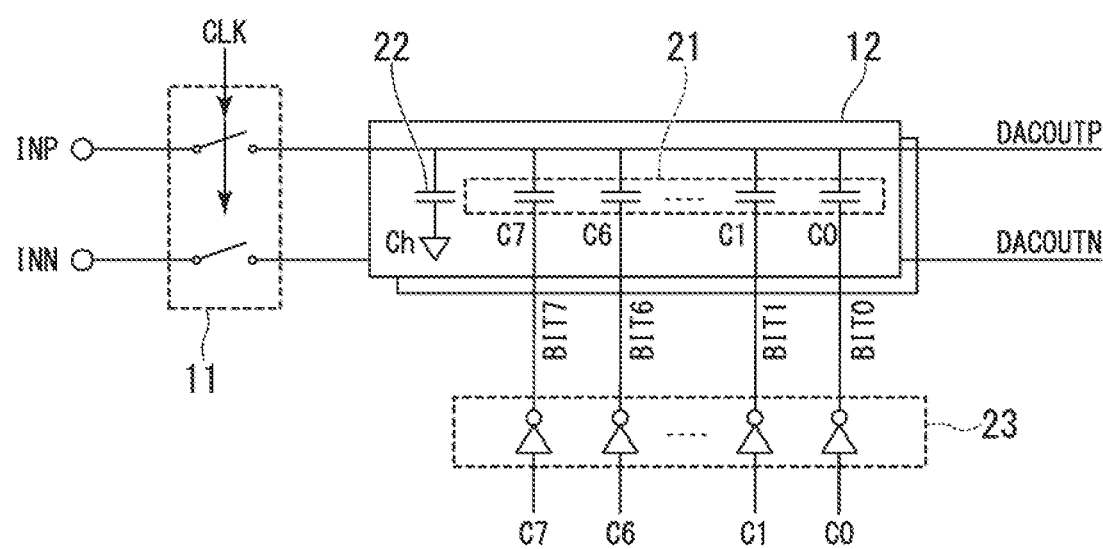
FIG. 15 is a circuit diagram illustrating one example of the configuration of a capacitive DAC circuit according to a conventional technology.
Figure 16A:
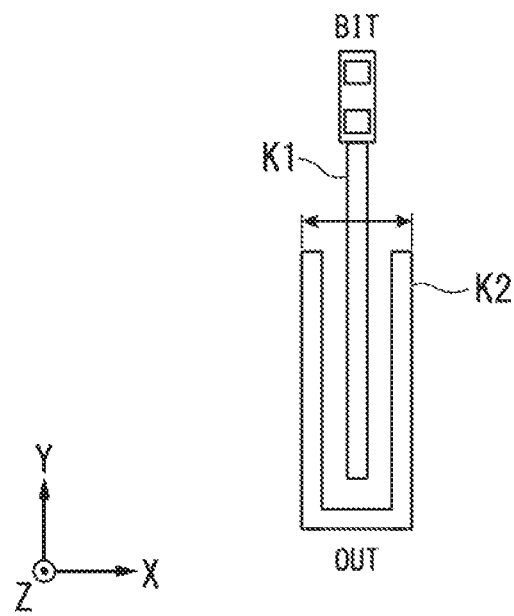
FIG. 16A is a pattern layout diagram of a unit capacitor configuring a DAC capacitor group and an attenuation capacitor in a capacitive DAC circuit according to a conventional technology.
Figure 16B:
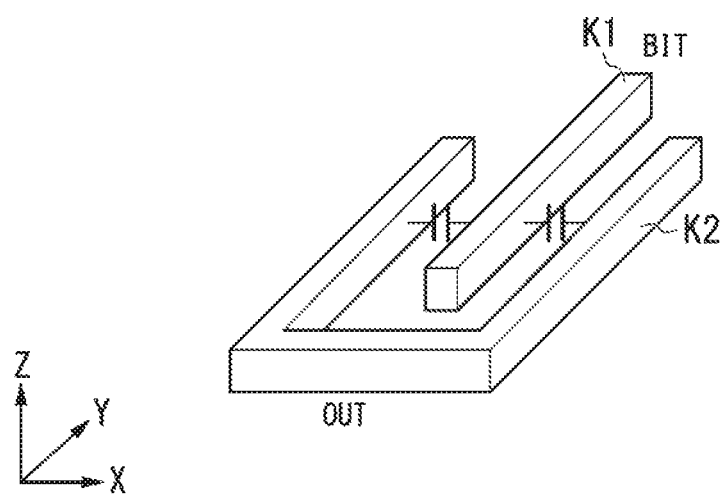
FIG. 16B is a perspective view of a unit capacitor configuring a DAC capacitor group and an attenuation capacitor in a capacitive DAC circuit according to a conventional technology.
Figure 17:
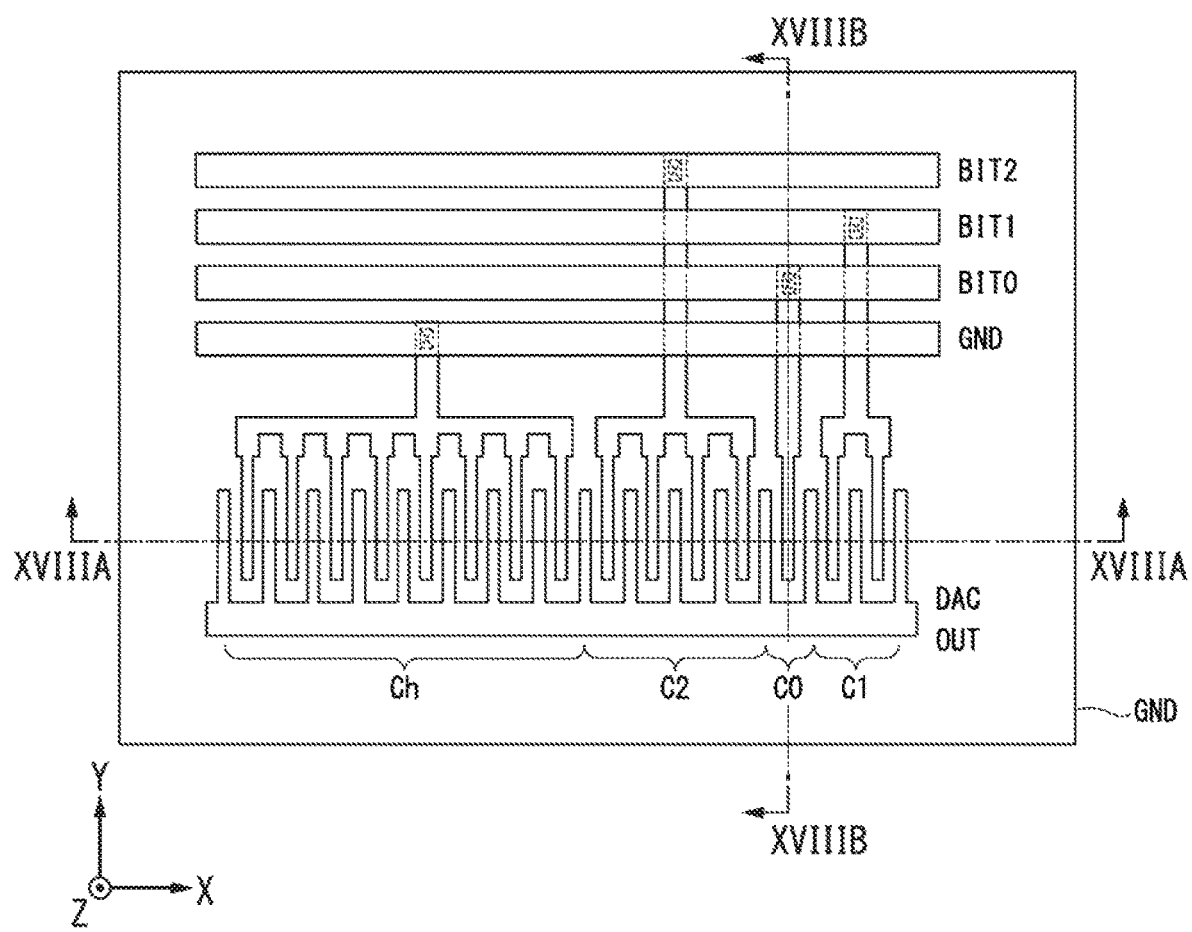
FIG. 17 is a top view illustrating the layout of a DAC capacitor group and an attenuation capacitor in a capacitive DAC circuit according to a conventional technology.
Figure 18A:
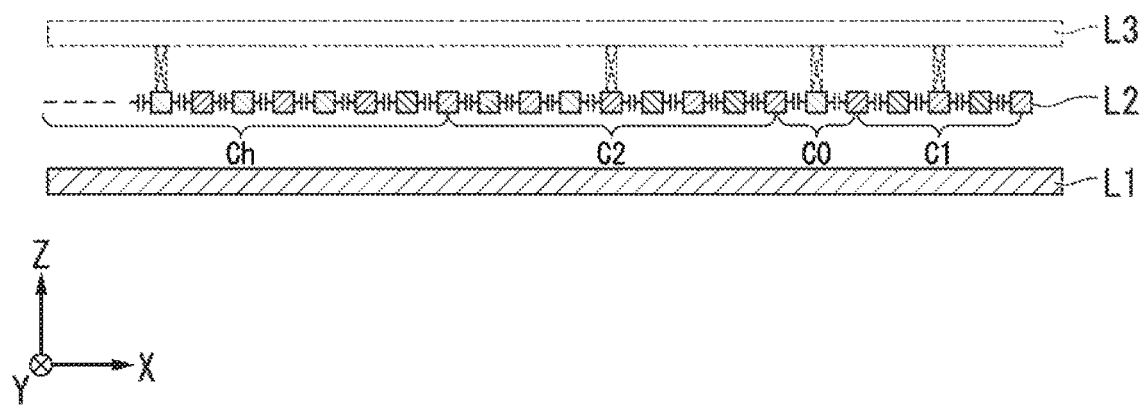
FIG. 18A is a cross-sectional view taken along line XVIIIA-XVIIIA illustrated in FIG. 17
Figure 18B:
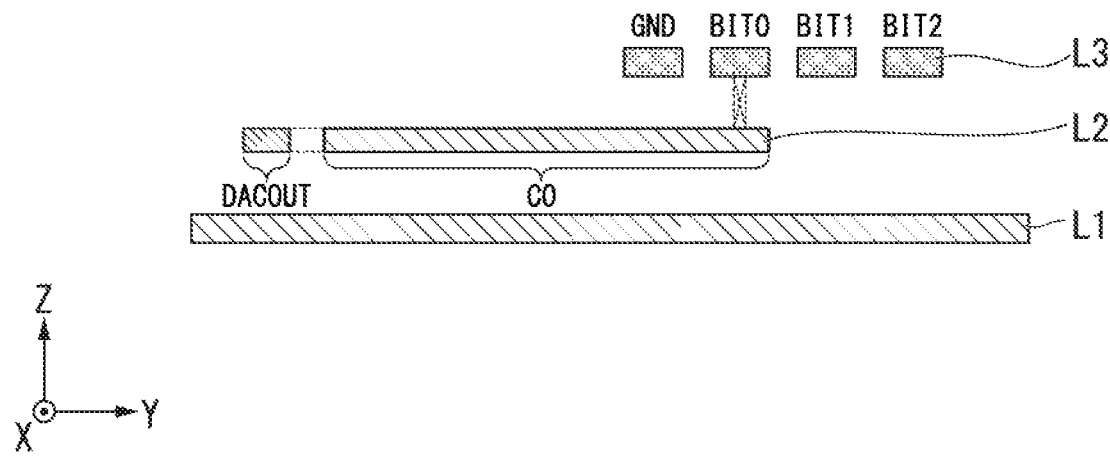
FIG. 18B is a cross-sectional view taken along line XVIIIB-XVIIIB illustrated in FIG. 17.
Figure 19:
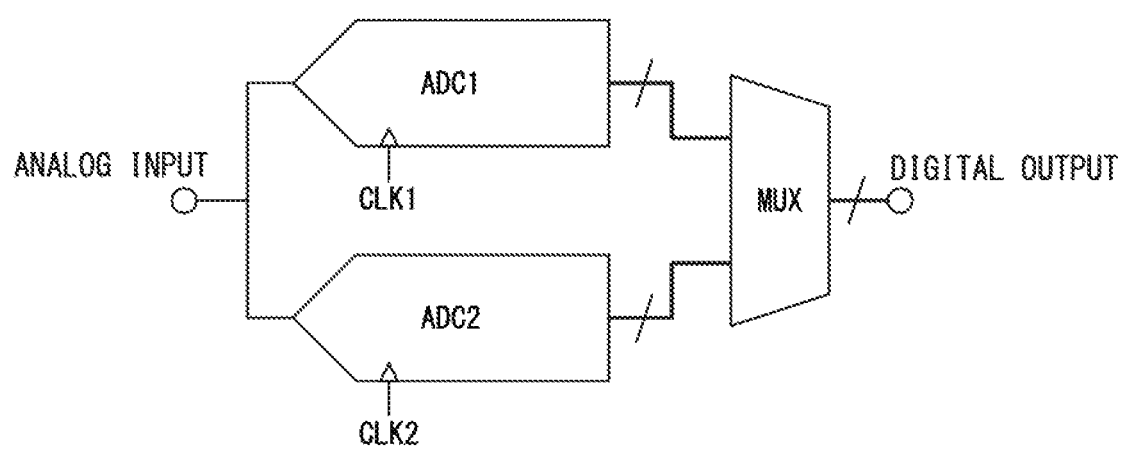
FIG. 19 is a block diagram illustrating the configuration of a successive approximation type A/D converter of a two-channel time interleave type using two successive approximation type A/D converters according to a conventional technology.
Figure 20:
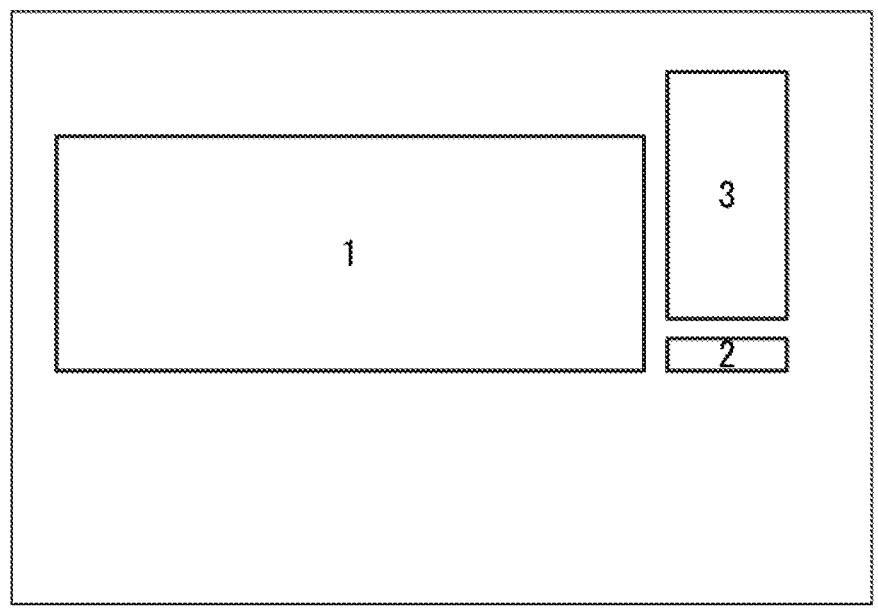
FIG. 20 is a top view illustrating a chip of a successive approximation type A/D converter according to a conventional technology.

FIG. 12 is a top view illustrating the layout of a DAC capacitor group (first capacitor group) and an attenuation capacitor (second capacitor group) in a capacitive DAC circuit of a successive approximation type A/D converter according to the sixth embodiment of the present invention. FIG. 13A is a cross-sectional view taken along line XIIIA-XIIIA illustrated in FIG. 12, and FIG. 13B is a cross-sectional view taken along line XIIIB-XIIIB illustrated in FIG. 12. In addition, a configuration that is not on a cross-section but would be visible from a side face is represented using broken lines in the drawing. The successive approximation type A/D converter according to the sixth embodiment, as illustrated in FIGS. 12, 13A, and 13B, is formed of four layers (a first metal layer L61, a second metal layer L62, a third metal layer L63, and a fourth metal layer L64).

More specifically, on the first metal layer L61 that is a GND plane for shielding, the second metal layer (first wiring layer) L62 configuring the DAC capacitor group (first capacitor group) C0 to C7 and a common electrode wiring DACOUT is formed. On the second metal layer L62, the third metal layer (third wiring layer) L63 that is a GND plane for shielding is formed. On the third metal layer L63, the fourth metal layer (second wiring layer) L64 configuring the attenuation capacitor (second capacitor group) Ch and a common electrode wiring DACOUT is formed. Here, on the fourth metal layer L64, bit-input wirings BIT0 to BIT7 of the DAC capacitor group C0 to C7 and a ground wiring GND connected to the attenuation capacitor Ch are also formed.

Each of the DAC capacitor group C0 to C7 is formed by arranging and integrating unit capacitors Cu on the second metal layer L62 in a horizontal direction (a direction X illustrated in the drawing). In the drawing, although only DAC capacitors C0, C1, and C2 are illustrated as the DAC capacitor group, actually, there are DAC capacitors C0 to C7 as the DAC capacitor group. The DAC capacitors C0, C1, C2, . . . are respectively connected to bit-input wirings BIT0, BIT1, BIT2, . . . on the fourth metal layer L64. In addition, each of the DAC capacitors C0 to C7 on the second metal layer L62 and the bit-input wirings BIT0 to BIT7 on the fourth metal layer L64 may be connected through a through hole formed in the third metal layer L63.

The attenuation capacitor Ch is formed by arranging and integrating unit capacitors Cu on the fourth metal layer L64 in the horizontal direction (the direction X in the drawing). The attenuation capacitor Ch is connected to the ground wiring GND on the fourth metal layer L64. The ground wiring GND on the fourth metal layer L64 and the third metal layer L53 that is a GND plane may be connected. In addition, the first metal layer L51 and the third metal layer L53 that are GND planes may be connected through a through hole formed in the second metal layer L52.

The operations and the effects of the successive approximation type A/D converter according to the sixth embodiment are similar to the operations and the effects of the successive approximation type A/D converter according to the second embodiment, the successive approximation type A/D converter according to the fourth embodiment, and the successive approximation type A/D converter according to the fifth embodiment. In other words, in the sixth embodiment, a capacitive DAC circuit is configured of stacking the layer configuring the DAC capacitor group C0 to C7 and the layer configuring the attenuation capacitors Ch to overlap each other. Accordingly, similar to the successive approximation type A/D converter according to the second embodiment, the successive approximation type A/D converter according to the fourth embodiment, and the successive approximation type A/D converter according to the fifth embodiment, the chip area can be configured to be almost half of that of the capacitive DAC circuit according to a conventional technology, and the chip area of the successive approximation type A/D converter can be significantly decreased. In other words, according to the sixth embodiment, a successive approximation type A/D converter having high resolution and good linearity can be realized with a small chip area.

In addition, in the successive approximation type A/D converter according to the sixth embodiment, compared to the successive approximation type A/D converter according to the second embodiment, the number of metal layers is reduced by two. In the successive approximation type A/D converter according to the sixth embodiment, compared to the successive approximation type A/D converter according to the fourth embodiment, the number of metal layers is reduced by one. Accordingly, the successive approximation type A/D converter according to the sixth embodiment realizes a successive approximation type A/D converter, of which the size is further decreased, which further reduces the manufacturing cost.

In this specification, terms representing directions such as "front," "rear," "upper," "lower," "right," "left," "vertical," "horizontal," "downward," "horizontal," "row," and "column" represent such directions in a device or apparatus according to the present invention. Thus, in the specification of the present invention, it is natural that such terms should be interpreted relatively in a device or apparatus according to the present invention.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An A/D converter comprising:
a first wiring layer including a first A/D conversion circuit including a first capacitor group in which a plurality of weighted unit capacitors are connected in parallel, and a second capacitor group in which a plurality of unit capacitors are connected in parallel, the second capacitor group being connected in parallel with the first capacitor group; and
a second wiring layer including a second A/D conversion circuit including a third capacitor group in which a plurality of weighted unit capacitors are connected in parallel, and a fourth capacitor group in which a plurality of unit capacitors are connected in parallel, the fourth capacitor group being connected in parallel with the third capacitor group,
wherein the first wiring layer and the second wiring layer are stacked such that the first A/D conversion circuit and the second A/D conversion circuit are disposed at overlapping positions.

2. The A/D converter according to claim 1, further comprising: a third wiring layer disposed between the first wiring layer and the second wiring layer and between a set of the first capacitor group and the second capacitor group and a set of the third capacitor group and the fourth capacitor group and connected to a ground electric potential.

3. A successive approximation type A/D converter that includes a sample hold circuit and a comparator, the successive approximation type A/D converter comprising:
a first wiring layer including a first capacitor group in which a plurality of weighted unit capacitors are connected in parallel and which constitutes a DAC capacitor group; and
a second wiring layer including a second capacitor group in which a plurality of unit capacitors are connected in parallel, which is connected to the first capacitor group, and which constitutes an attenuation capacitor group,
wherein the first capacitor group and the second capacitor group are connected in parallel to one end of the sample hold circuit and an input terminal of the comparator, and
the first wiring layer and the second wiring layer are stacked such that the first capacitor group and the second capacitor group are disposed at overlapping positions.

4. The successive approximation type A/D converter according to claim 3, further comprising: a third wiring layer disposed between the first wiring layer and the second wiring layer, and between the first capacitor group and the second capacitor group and connected to a ground electric potential.

5. The successive approximation type A/D converter according to claim 4, wherein a ground wiring of the second capacitor group is connected to the third wiring layer.

6. The successive approximation type A/D converter according to claim 3, wherein bit-input wirings connected to the first capacitor group are formed in the second wiring layer including the second capacitor group.

7. The A/D converter according to claim 1, wherein each of the first capacitor group and the second capacitor group is a MOM capacitor configured of inter-wiring capacitance generated in a horizontal direction of the same wiring layer.

8. The successive approximation type A/D converter according to claim 3, wherein each of the first capacitor group and the second capacitor group is a MOM capacitor configured of inter-wiring capacitance generated in a horizontal direction of the same wiring layer.

* * * * *